United States Patent
Wu et al.

(10) Patent No.: US 12,419,036 B2
(45) Date of Patent: Sep. 16, 2025

(54) SEMICONDUCTOR STRUCTURE AND MANUFACTURING METHOD THEREOF

(71) Applicant: CHANGXIN MEMORY TECHNOLOGIES, INC., Hefei (CN)

(72) Inventors: Gongyi Wu, Hefei (CN); Xinran Liu, Hefei (CN); Yachao Xu, Hefei (CN); Longyang Chen, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 491 days.

(21) Appl. No.: 17/936,119

(22) Filed: Sep. 28, 2022

(65) Prior Publication Data

US 2023/0301066 A1    Sep. 21, 2023

(30) Foreign Application Priority Data

Mar. 17, 2022    (CN) .......................... 202210266469.4

(51) Int. Cl.
*H10B 12/00*    (2023.01)
(52) U.S. Cl.
CPC ......... *H10B 12/315* (2023.02); *H10B 12/482* (2023.02)
(58) Field of Classification Search
CPC ........................... H10B 12/482; H10B 12/315
See application file for complete search history.

(56) References Cited

U.S. PATENT DOCUMENTS

| | | | |
|---|---|---|---|
| 9,786,598 B2 | 10/2017 | Kim et al. | |
| 10,505,111 B1* | 12/2019 | Ok | H01L 21/7682 |
| 11,094,794 B2* | 8/2021 | Frougier | H10D 30/6219 |
| 2022/0059543 A1* | 2/2022 | Mun | H10B 12/34 |
| 2022/0320104 A1* | 10/2022 | Zhu | H10B 12/315 |

FOREIGN PATENT DOCUMENTS

| | | |
|---|---|---|
| CN | 105280608 B | 5/2019 |
| CN | 112582462 A | 3/2021 |

* cited by examiner

*Primary Examiner* — Steven M Page
(74) *Attorney, Agent, or Firm* — Kilpatrick Townsend & Stockton LLP

(57) ABSTRACT

Embodiments of the present disclosure relate to the field of semiconductor structures, and provide a semiconductor structure and a manufacturing method thereof. The semiconductor structure includes: a base; a plurality of first conductive structures, located on a surface of the base and distributed at intervals along a first direction; a plurality of second conductive structures, located on the surface of the base, and the plurality of second conductive structures and the plurality of first conductive structures being arranged alternately; and a plurality of support structures, located on the surface of the base and a given one of the plurality of support structures being located between a given one of the plurality of first conductive structures and a given one of the plurality of second conductive structures.

18 Claims, 17 Drawing Sheets

SEMICONDUCTOR STRUCTURE AND MANUFACTURING METHOD THEREOF

CROSS-REFERENCE TO RELATED APPLICATION

This application claims the priority of Chinese Patent Application No. 202210266469.4, submitted to the Chinese Intellectual Property Office on Mar. 17, 2022, the disclosure of which is incorporated herein in its entirety by reference.

TECHNICAL FIELD

Embodiments of the present disclosure relate to the field of semiconductors, and in particular to, a semiconductor structure and a manufacturing method thereof.

BACKGROUND

With the continuous development of integrated circuit technology and process technology, to improve the integration degree of integrated circuits, the feature size of transistor (MOS) devices is continuously reduced. Under the process nodes such as the high-K metal gate (HKMG) and the fin transistor (Finfet), a series of problems need to be resolved while the operation speed of MOS devices is increased and its power consumption is reduced.

To reduce the power consumption of the MOS device, those skilled in the art use metal wires as the connection medium at a plurality of process nodes based on the advantage of the low resistance of the metal, which brings a series of problems. For example, a short circuit between adjacent metal wires leads to a chip failure, and a parasitic capacitance exists between adjacent metal wires.

SUMMARY

According to some embodiments of the present disclosure, an aspect of the embodiments of the present disclosure provides a semiconductor structure, including: a base; a plurality of first conductive structures, located on a surface of the base and distributed at intervals along a first direction; a plurality of second conductive structures, located on the surface of the base and the plurality of second conductive structures and the plurality of first conductive structures being arranged alternately; and a plurality of support structures, located on the surface of the base and a given one of the plurality of support structures being located between a given one of the plurality of first conductive structures and a given one of the plurality of second conductive structures, where the given one of the plurality of support structures is provided with a support layer therein arranged along the first direction and a cavity divided by the support layer, and the given one of the plurality of support structures extends along a side surface of the given one of the plurality of first conductive structures.

According to some embodiments of the present disclosure, another aspect of the embodiments of the present disclosure provides a method of manufacturing a semiconductor structure, including: providing a base; forming a plurality of first conductive structures and a plurality of second conductive structures, where the plurality of first conductive structures are located on a surface of the base and are distributed at intervals along a first direction, and the plurality of second conductive structures are located on the surface of the base and the plurality of second conductive structures and the plurality of first conductive structures are arranged alternately; and forming a plurality of support structures located on the surface of the base and a given one of the plurality of support structures being located between a given one of the plurality of first conductive structures and a given one of the plurality of second conductive structures, where the given one of the plurality of support structures is provided with a support layer therein arranged along the first direction and a cavity divided by the support layer, and the given one of the plurality of support structures extends along a side surface of the given one of the plurality of first conductive structures.

BRIEF DESCRIPTION OF THE DRAWINGS

One or more embodiments are exemplified by corresponding accompanying drawings, and these exemplified descriptions do not constitute a limitation on the embodiments. The accompanying drawings are not limited by scale unless otherwise specified. To describe the technical solutions in the embodiments of the present disclosure or in the prior art more clearly, the following outlines the accompanying drawings to be used in the embodiments of the present disclosure. Apparently, the accompanying drawings outlined below are merely some embodiments of the present disclosure. Those of ordinary skill in the art may derive other drawings from the outlined accompanying drawings without making any creative effort.

DETAILED DESCRIPTION

Embodiments of the present disclosure provide a semiconductor structure and a manufacturing method thereof. The semiconductor structure includes: a plurality of support structures located on the surface of the base, and a given one of the plurality of support structures being located between a given one of a plurality of first conductive structures and a given one of a plurality of second conductive structures. The given one of the plurality of support structures is provided with the support layer therein arranged along the first direction and a cavity divided by the support layer. The given one of the plurality of support structures extends along the side surface of the given one of the plurality of first conductive structures, and the cavity can reduce the parasitic capacitance of the given one of the plurality of first conductive structures and the given one of the plurality of second conductive structures. The support layer can function as a protection layer between the given one of the plurality of first conductive structures and the given one of the plurality of second conductive structures, which can avoid the short circuit caused by structural deformation at the sides of the given one of the plurality of first conductive structures and the given one of the plurality of second conductive structures. The cavity divided by the support layer and disposed in the given one of the plurality of support structures can avoid structural deformation due to various stresses in the subsequent process.

The embodiments of the present disclosure are described in detail below with reference to the accompanying drawings. However, those of ordinary skill in the art can understand that many technical details are proposed in the embodiments of the present disclosure to help readers better understand the present disclosure. However, even without these technical details and various changes and modifications made based on the following embodiments, the technical solutions claimed in the present disclosure may still be realized.

Figure 1:
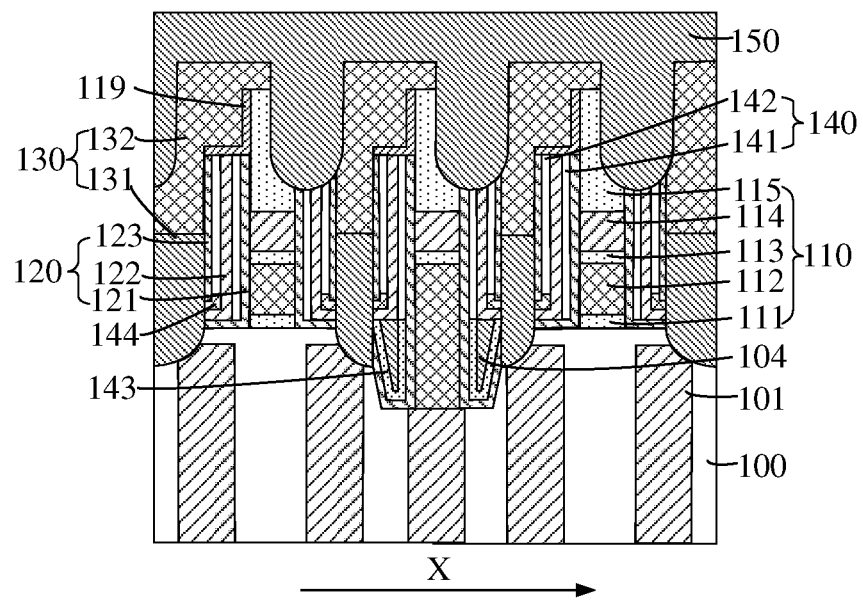
FIG. 1 is a schematic structural cross-sectional view of a semiconductor structure according to an embodiment of the present disclosure.

FIG. 1 is a schematic structural cross-sectional view of a semiconductor structure according to an embodiment of the present disclosure.

With reference to FIG. 1, the semiconductor structure includes: a base 100; a plurality of first conductive structures, located on a surface of the base 100 and distributed at intervals along a first direction X; a plurality of second conductive structures, located on the surface of the base 100, and the plurality of second conductive structures and the plurality of first conductive structures being arranged alternately; and a plurality of support structures, located on the surface of the base 100 and a given one of the plurality of support structures being located between a given one of the plurality of first conductive structures and a given one of the plurality of second conductive structures, where the given one of the plurality of support structures is provided with a support layer 120 therein arranged along the first direction X and a cavity 140 divided by the support layer, and the given one of the plurality of support structures extends along a side surface of the given one of the plurality of first conductive structures.

In some embodiments, the base 100 may be a made of a semiconductor material. The semiconductor material specifically may be any one selected from the group consisting of silicon, germanium, silicon germanide, or silicon carbide.

In some embodiments, the given one of the plurality of first conductive structures is a bit line 110 extending along the second direction. The second direction intersects the first direction X. Preferably, orthographic projection of the second direction and the orthographic projection of the first direction X on the base 100 are perpendicular to each other. The bit line 110 includes a first barrier layer 111, a polysilicon layer 112, a second barrier layer 113, a conductive layer 114, and a dielectric layer 115 that are stacked. The first barrier layer 111 is configured to prevent element diffusion between the polysilicon layer 112 and the base, and the second barrier layer 113 is used for ion diffusion between the conductive layer 114 and the polysilicon layer 112, and reduce the contact resistance of a bit line contact hole. The material of the first barrier layer 111 may be one or more selected from the group consisting of silicon nitride, silicon oxide, or silicon carbide. The material of the polysilicon layer 112 may be one or more selected from the group consisting of amorphous silicon, microcrystalline silicon, or polycrystalline silicon. The material of the second barrier layer 113 may be TiN, SiN, titanium dinitride ($Ti_2N_2$), and titanium tetranitride ($Ti_3N_4$). The material of the conductive layer 114 may be metals such as tungsten, copper, and silver. The resistance of the metal is small, which is beneficial to improving the conductivity of the bit line 110 and the second conductive structure. The material of the dielectric layer 115 may be silicon oxide or silicon nitride.

In some embodiments, the given one of the plurality of second conductive structures is a storage node contact structure 130, and the storage node contact structure 130 may specifically be a capacitor structure. The storage node contact structure 130 includes a capacitor contact layer 131 and a capacitor conductive layer 132, and the capacitor contact layer 131 may be a polysilicon layer. The polysilicon layer may be doped with N-type doping elements or P-type doping elements. Doping elements may serve as carriers, to improve the migration and diffusion of carriers between the bit line 110 and the storage node contact structure 130, thereby improving the electrical conductivity between the bit line 110 and the storage node contact structure 130, and reducing the contact resistance of the storage node contact structure 130. Specifically, the N-type element may be a group V element such as phosphorus (P), bismuth (Bi), antimony (Sb), or arsenic (As), and the P-type element may be a group III element such as boron (B), aluminum (Al), gallium (Ga) or indium (In). The capacitor conductive layer 132 is made of metals such as tungsten, copper, and silver, and the metal has a low resistance, which is therefore beneficial to improving the conductivity of the bit line 110 and the storage node contact structure 130.

In some embodiments, in a direction perpendicular to the surface of the base 100, the support layer 120 is as high as ⅓ to ⅔ of the bit line 110, and the top surface of the support layer 120 away from the base 100 is not lower than that of the conductive layer 114, which can contact between the bit line 110 and the storage node contact structure 130, thereby avoiding the risk of a short circuit between the bit line 110 and the storage node contact structure 130, and improving the safety of the semiconductor structure.

In some embodiments, a ratio of a thickness of the cavity 140 to that of the support layer 120 ranges from 1/3 to 4/3. This range set can avoid the risks caused by two aspects at the same time. On the one hand, if the ratio of the thickness of the cavity 140 to that of the support layer 120 is too small, that is, the thickness of the cavity 140 may be too small, the high-k constant (a K value) may be increased. Thus, there is a risk of an excessively large parasitic capacitance between the bit line 110 and the storage node contact structure 130. On the other hand, if the foregoing ratio is too large, that is, the thickness of the support layer 120 may be too small, the support layer 120 may not be able to withstand various stresses, resulting in the deformation of the cavity 140. Thus, an increased K value may cause the parasitic capacitance between the bit line 110 and the storage node contact structure 130 to increase, and lead to a short-circuit risk between them.

In some embodiments, the support layer 120 includes a first support layer 121, a second support layer 122, and a third support layer 123, the first support layer 121 is located between the bit line 110 and the cavity 140, the second support layer 122 is located in a middle of the cavity 140, and the third support layer 123 is located between the storage node contact structure 130 and the cavity 140; and a thickness of the first support layer 121 or the third support layer 123 is smaller than or equal to that of the second support layer 122. The second support layer 122 in the cavity 140 is relatively thick, and can support the sides of the cavity 140, such that the support structure can withstand various stresses in the subsequent process, thereby avoiding deformation of the side surfaces of the cavity 140, and enabling the structure of the cavity 140 to be complete. This may avoid that the K value increases to cause the parasitic capacitance between the bit line 110 and the storage node contact structure 130 and lead to the short-circuit risk between them. The thickness of the second support layer 122 ranges from 2 nm to 4 nm, and may specifically be 2 nm, 2.3 nm, 3.1 nm, or 3.9 nm. The thickness of the first support layer 121 and the thickness of the third support layer 123 may both range from 1 nm to 2 nm, and specifically may be 1 nm, 1.3 nm, 1.6 nm, or 1.9 nm.

It can be understood that the first support layer 121 and the third support layer 123 may have a same thickness or not. Their thicknesses may be set respectively according to performances of the adjacent first conductive structure and the adjacent second conductive structure.

In some embodiments, the first support layer 121, the second support layer 122, and the third support layer 123 may be made of a same material such as silicon boron carbon nitride. Because silicon boron carbon nitride is relatively strong and hard, the three support layers made of it are also relatively strong and hard, and can withstand various stresses in the subsequent process, thereby avoiding deformation of the side surfaces of the cavity 140, and enabling the structure of the cavity 140 to be complete. This may avoid that the K value increases to cause the parasitic capacitance between the bit line 110 and the storage node contact structure 130 to increase and lead to the short-circuit risk between them. In some other embodiments, the first support layer 121, the second support layer 122, and the third support layer 123 may be made of different materials such as silicon nitride or silicon carbonitride.

In some embodiments, the cavity 140 includes a first cavity 141 and a second cavity 142 separated by the second support layer 122. The thickness of the first cavity 141 and the thickness of the second cavity 142 both range from 1 nm to 3 nm, and may be specifically, 1 nm, 1.3 nm, 2.2 nm, or 2.9 nm. While ensuring that the parasitic capacitance between the bit line 110 and the storage node contact structure 130 is small, the thickness range of the first cavity 141 and the second cavity 142 ensures that the thickness of the support layer 120 is large. The support layer 120 with such a thickness can withstand various stresses in the subsequent process, to avoid structural deformation of the first cavity 141 and the second cavity 142. It can be understood that the first cavity 141 and the second cavity 142 can have a same thickness or not.

In some embodiments, a first isolation film 143 is provided at the bottom of the first cavity 141 close to the base 100. A second isolation film 144 is provided at the bottom of the second cavity 142 close to the base 100. Along the direction perpendicular to the base 100, the top surface of the first isolation film 143 away from the base 100 is not higher than the conductive layer 114 of the bit line 110, and the top surface of the second isolation film 144 away from the base 100 is not higher than the conductive layer 114 of the bit line 110. In this way, there is enough space in the first cavity 141 and the second cavity 142 to decrease the K value, which can reduce the parasitic capacitance between the bit line 110 and the storage node contact structure 130. Specifically, a thickness of the first isolation film 143 ranges from 0 nm to 10 nm, such as 1 nm, 3 nm, 5.6 nm, or 8.9 nm. The thickness of the second isolation film 144 ranges from 0 nm to 10 nm, such as 1.3 nm, 3.5 nm, 6.6 nm, or 9.8 nm.

In some embodiments, the semiconductor structure further includes: a protective layer 119, an insulating layer 104, and an isolation structure 150. The protective layer 119 is located between the given one of the plurality of support structures and the given one of the plurality of storage node contact structures 130. The insulating layer 104 is located in the plurality of support structures, and the insulating layer 104 is located between the first isolation film 143 and the second support layer 122. The isolation structure 150 is located between the given one of the plurality of bit lines 110 and the given one of the plurality of storage node contact structures 130 that are adjacent to each other. The isolation structure 150 is located on the top surfaces of plurality of the bit lines 110 and the top surfaces of the plurality of storage node contact structures 130. The material of the protective layer 119 may be silicon boron carbon nitride, silicon nitride, or silicon carbonitride, and the material of the insulating layer 104 may be silicon dioxide, silicon carbide, or silicon nitride. The isolation structure 150 may be a single-layer structure or a stacked multi-layer structure, and the material of the isolation structure 150 may be one or more selected from the group consisting of silicon dioxide, silicon carbide, or silicon nitride.

In the technical solutions provided by the embodiment (FIG. 1) of the present application, the given one of the plurality of support structures is located on the surface of the base 100 and between the given one of the plurality of bit lines 110 and the given one of the plurality of storage node contact structures 130. The given one of the plurality of support structures is provided with the support layer 120 therein arranged along the first direction X and a cavity 140 divided by the support layer 120. The given one of the plurality of support structures extends along the side surface of the given one of the plurality of bit lines 110, and the cavity 140 can reduce the parasitic capacitance of the given one of the plurality of bit lines 110 and the given one of the plurality of storage node contact structures 130. The support layer 120 can function as a protection layer between the given one of the plurality of bit lines 110 and the given one of the plurality of storage node contact structures 130, which can avoid the short circuit caused by structural deformation at the sides of the given one of the plurality of bit lines 110 and the given one of the plurality of storage node contact structures 130. The cavity 140 divided by the support layer 120 and disposed in the given one of the plurality of support structures can avoid structural deformation due to various stresses in the subsequent process.

Correspondingly, another embodiment of the present disclosure provides a semiconductor structure. A semiconductor structure provided by another embodiment of the present disclosure is substantially the same as the one provided by the foregoing embodiment (FIG. 1). The main difference is that the given one of the plurality of first conductive structures provided by the foregoing embodiment of the present disclosure is a bit line, and the given one of the plurality of second conductive structures is a storage node contact structure, and the given one of the plurality of first conductive structures and the given one of the plurality of second conductive structures in the semiconductor structure provided by the another embodiment of the present disclosure are both gate structures. Details of contents or elements the same as or similar to those described in the foregoing embodiments are not repeated, and the ones different from the above are described in detail. The semiconductor structure provided by the another embodiment of the present disclosure is described in detail below with reference to FIG. 2.

Figure 2:
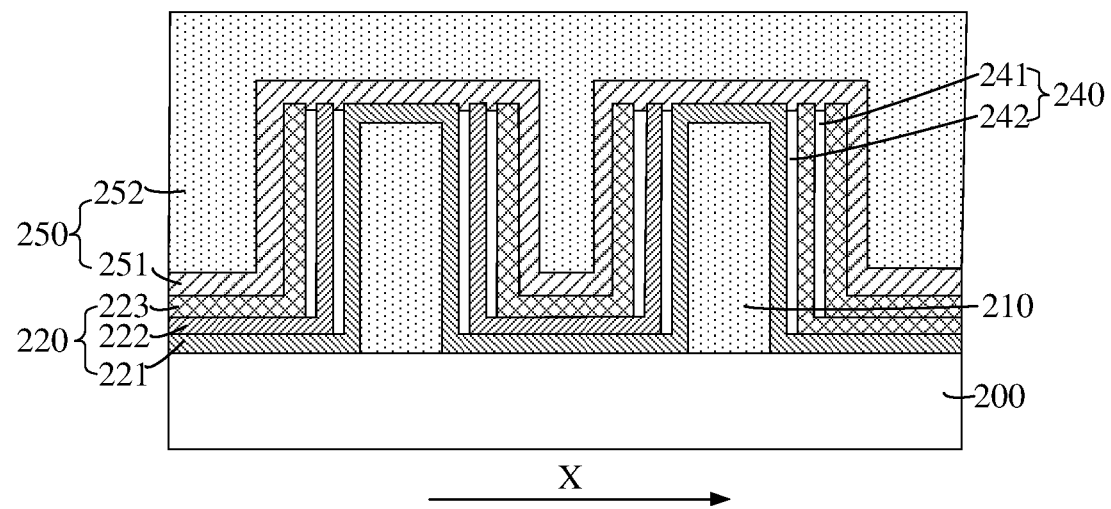
FIG. 2 is a schematic structural cross-sectional view of a semiconductor structure according to another embodiment of the present disclosure.

FIG. 2 is a schematic structural cross-sectional view of a semiconductor structure according to another embodiment of the present disclosure.

With reference to FIG. 2, the semiconductor structure includes: a base 200; a plurality of first conductive structures located on a surface of the base 200 and distributed at intervals along a first direction X; a plurality of second conductive structures located on the surface of the base 200, and the plurality of second conductive structures and the plurality of first conductive structures being arranged alternately; a plurality of support structures located on the surface of the base 200 and a given one of the plurality of support structures being located between a given one of the plurality of first conductive structures and a given one of the plurality of second conductive structures, where the given one of the plurality of support structures is provided with a support layer 220 therein arranged along the first direction X and a cavity 240 divided by the support layer 220, and the given one of the plurality of support structures extends along a side surface of the given one of the plurality of first conductive structures.

In some embodiments, the given one of the plurality of first conductive structures and the given one of the plurality of second conductive structures are both the gate structures 210, and the gate structures 210 serve as the word lines of the semiconductor structure. The plurality of gate structures 210 are spaced apart along the first direction X, and the given one of the plurality of support structures are located between adjacent gate structures 210.

In some embodiments, along the first direction X, the support layer 220 includes a first spacing layer 221, a second spacing layer 222, and a third spacing layer 223, the first spacing layer 221 is located between the gate structure 210 and the cavity 240, the second spacing layer 222 is located in a middle of the cavity 240, and the third spacing layer 223 is located between the isolation structure 250 and the cavity 240; and a thickness of the first spacing layer 221 or the third spacing layer 223 is smaller than or equal to that of the second spacing layer 222. The second spacing layer 222 in the cavity 240 is relatively thick, and can support the side surface of the cavity 240, such that the support structure can withstand various stresses in the subsequent process, thereby avoiding deformation of the side surfaces of the cavity 240, and enabling the structure of the cavity 240 to be complete. This may avoid that the K value increases to cause the parasitic capacitance between adjacent gate structures 210 to increase and lead to the short-circuit risk between them. The thickness of the first spacing layer 221 ranges from 2 nm to 8 nm, and may specifically be 2 nm, 4.6 nm, 6.8 nm, or 7.8 nm. The thickness of the second spacing layer 222 may range from 2 nm to 10 nm, and may specifically be 2 nm, 5.6 nm, 8.1 nm, or 9.8 nm. The thickness of the third spacing layer 223 may range from 4 nm to 10 nm, and may specifically be 4 nm, 5.3 nm, 8.6 nm, or 9.9 nm.

In some embodiments, the first spacing layer 221, the second spacing layer 222, and the third spacing layer 223 may be made of a same material such as silicon boron carbon nitride. Because silicon boron carbon nitride is relatively strong and hard, the three spacing layers made of it are also relatively strong and hard, and can withstand various stresses in the subsequent process, thereby avoiding deformation of the side surfaces of the cavity 140, and enabling the structure of the cavity 140 to be complete. This may avoid that the K value increases to cause the parasitic capacitance between adjacent gate structures 210 to increase and lead to the short-circuit risk between them. In some other embodiments, the first spacing layer 221, the second spacing layer 222, and the third spacing layer 223 may be made of different materials such as silicon nitride or silicon carbonitride.

In some embodiments, along the first direction X, the thickness of the cavity 240 ranges from 2 nm to 20 nm. The cavity 240 includes a first cavity 241 and a second cavity 242 separated by the second spacing layer 222. The thickness of the first cavity 241 and the thickness of the second cavity 242 both range from 2 nm to 10 nm, and may be specifically, 2 nm, 3.8 nm, 6.2 nm, or 8.9 nm. While ensuring that the parasitic capacitance between adjacent gate structures 210 is small, the thickness range of the first cavity 241 and the second cavity 242 ensures that the support layer 220 is relatively thick. The support layer 220 with such a thickness can withstand various stresses in the subsequent process, to avoid structural deformation of the first cavity 241 and the second cavity 242. It can be understood that the first cavity 241 and the second cavity 242 can have a same thickness or not.

In some embodiments, the semiconductor structure further includes an isolation structure 250 located between adjacent two of the plurality of support structures, where the given one of the plurality of support structures also extends along a side surface of the given one of the plurality of second conductive structures. Specifically, the given one of the plurality of support structures extends along the side surface of the given one of the plurality of gate structures 210. The isolation structure 250 includes a first isolation layer 251 and a second isolation layer 252 that are stacked. The materials of the first isolation layer 251 and the second isolation layer 252 may be one or more selected from the group consisting of silicon dioxide, silicon carbide, or silicon nitride.

In the technical solutions provided by the embodiment (FIG. 2) of the present application, the given one of the plurality of support structures is located on the surface of the base 200 and between adjacent gate structures 210. The given one of the plurality of support structures is provided with the support layer 220 therein arranged along the first direction X and a cavity 240 divided by the support layer 220. The given one of the plurality of support structures extends along the side surface of the given one of the plurality of gate structures 210, and the cavity 240 can reduce the parasitic capacitance between adjacent gate structures 210. The support layer 220 can function as a protection layer between adjacent gate structures 210, which can avoid the short circuit caused by structural deformation at the sides of adjacent gate structures 210. The cavity 240 separated by the support layer 220 and disposed in the given one of the plurality of support structures can avoid structural deformation due to various stresses in the subsequent process.

Correspondingly, another embodiment of the present disclosure also provides a semiconductor structure. A semiconductor structure provided by another embodiment of the present disclosure is substantially the same as the one provided by the foregoing embodiment (FIG. 1 or 2). The main difference is that the given one of the plurality of first conductive structures provided by the foregoing embodiment of the present disclosure is a bit line, and the given one of the plurality of second conductive structures is a storage node contact structure, and the given one of the plurality of first conductive structures and the given one of the plurality of second conductive structures in the semiconductor structure provided by the another embodiment of the present disclosure are both metal wire structures. Details of contents or elements the same as or similar to those described in the foregoing embodiments are not repeated, and the ones different from the above are described in detail. The semiconductor structure provided by the another embodiment of the present disclosure is described in detail below with reference to FIG. 3.

Figure 3:
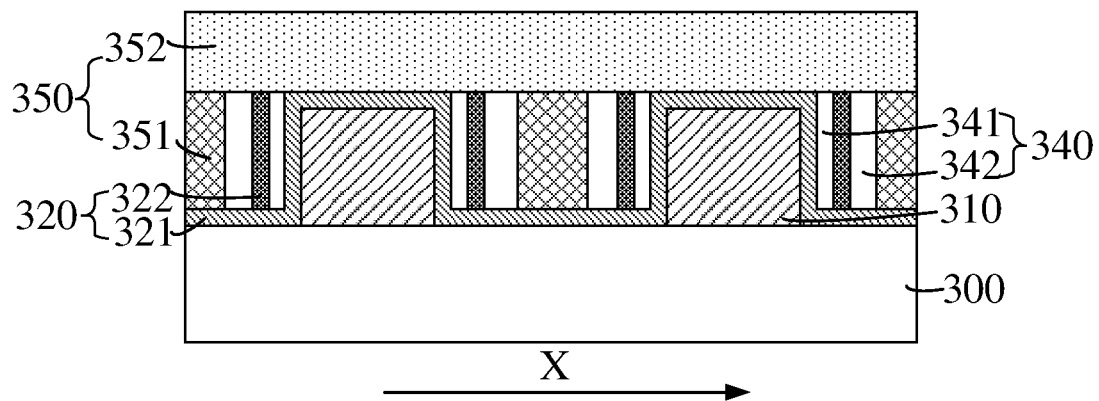
FIG. 3 is a schematic structural cross-sectional view of the semiconductor structure according to another embodiment of the present disclosure.

FIG. 3 is a schematic structural cross-sectional view of the semiconductor structure according to another embodiment of the present disclosure.

With reference to FIG. 3, the semiconductor structure includes: a base 300; a plurality of first conductive structures located on a surface of the base 300 and distributed at intervals along a first direction X; a plurality of second conductive structures located on the surface of the base 300, and the plurality of second conductive structures and the plurality of first conductive structures being arranged alternately; a plurality of support structures located on the surface of the base 300 and a given one of the plurality of support structures being located between a given one of the plurality of first conductive structures and a given one of the plurality of second conductive structures, where the given one of the plurality of support structures is provided with a support layer 320 therein arranged along the first direction X and a cavity 340 divided by the support layer 320, and the given one of the plurality of support structures extends along a side surface of the given one of the plurality of first conductive structures.

In some embodiments, the given one of the plurality of first conductive structures and the given one of the plurality of second conductive structures are both metal wire structures 310, and the metal wire structures 310 serve as the solder joints of the semiconductor structure. The plurality of metal wire structures 310 are spaced apart along the first direction X, and the support structures are located between adjacent metal wire structures 310.

In some embodiments, along the first direction X, the support layer 320 includes a fourth spacing layer 321 and a fifth spacing layer 322. The fourth spacing layer 321 is located between the metal wire structure 310 and the cavity 340. The fifth spacing layer 322 is located in the middle of the cavity 340. The fourth spacing layer 321 is thinner than the fifth spacing layer 322. The fifth spacing layer 322 in the cavity 340 is relatively thick, and can support the side surface of the cavity 340, such that the support structure can withstand various stresses in the subsequent process, thereby avoiding deformation of the side surfaces of the cavity 340, and enabling the structure of the cavity 340 to be complete. This may avoid that the K value increases to cause the parasitic capacitance between adjacent metal wire structures 310 to increase and lead to the short-circuit risk between them. The thickness of the fourth spacing layer 321 may range from 2 nm to 8 nm, and may specifically be 2 nm, 4.6 nm, 6.8 nm, or 7.8 nm. The thickness of the fifth spacing layer 322 may range from 4 nm to 10 nm, and may specifically be 4 nm, 5.3 nm, 8.6 nm, or 9.9 nm.

In some embodiments, along the first direction X, the thickness of the cavity 340 ranges from 2 nm to 20 nm. The cavity 340 includes a first cavity 341 and a second cavity 342 separated by the fourth spacing layer 322. The thickness of the first cavity 341 and the thickness of the second cavity 342 both range from 2 nm to 10 nm, and may be specifically, 2 nm, 3.8 nm, 6.2 nm, or 8.9 nm.

In some embodiments, the semiconductor structure further includes an isolation structure 350 located between adjacent two of the plurality of support structures, where the given one of the plurality of support structures also extends along a side surface of the given one of the plurality of second conductive structures. Specifically, the given one of the plurality of support structures extends along the side surface of the given one of the plurality of metal wire structures 310. Along the first direction X, the thickness of the isolation structure 350 ranges from 5 nm to 30 nm. The isolation structure 350 includes a first isolation layer 351 and a second isolation layer 352. The first isolation layer 351 is located between adjacent support structures, and the second isolation layer 352 is located on the top surfaces of the support structures, the top surfaces of the metal wire structures 310, and the top surface of the first isolation layer 351. Materials of the first isolation layer 351 and the second isolation layer 352 may be one or more selected from the group consisting of silicon dioxide, silicon carbide, or silicon nitride.

In the technical solutions provided by the embodiment (FIG. 3) of the present application, the given one of the plurality of support structures is located on the surface of the base 300 and between adjacent metal wire structures 310. The given one of the plurality of support structures is provided with the support layer 320 therein arranged along the first direction X and a cavity 340 divided by the support layer 320. The given one of the plurality of support structures extends along the side surface of the given one of the plurality of metal wire structures 310, and the cavity 340 can reduce the parasitic capacitance between adjacent metal wire structures 310. The support layer 320 can function as a protection layer between adjacent metal wire structures 310, which can avoid the short circuit caused by structural deformation at the sides of adjacent metal wire structures 310. The cavity 340 separated by the support layer 320 and disposed in the given one of the plurality of support structures can avoid structural deformation due to various stresses in the subsequent process.

Some embodiments of the present disclosure provide a method of manufacturing a semiconductor structure, which can be used to form the semiconductor structure provided by some foregoing embodiments. The method of manufacturing a semiconductor structure provided by some embodiments of the present disclosure will be described below in detail with reference to the accompanying drawings. FIGS. 4 to 25 are schematic structural cross-sectional views corresponding to various steps of a method of manufacturing a semiconductor structure according to an embodiment of the present disclosure. FIGS. 11 to 14, 22, and 24 are schematic structural cross-sectional views of a semiconductor structure taken along A-A.

With reference to FIGS. 4 to 25, the method of manufacturing a semiconductor structure includes: providing a base 100; forming a plurality of first conductive structures and a plurality of second conductive structures, where the plurality of first conductive structures are located on a surface of the base 100 and distributed at intervals along a first direction X, and plurality of second conductive structures located on the surface of the base 100, and the plurality of second conductive structures and the plurality of first conductive structures are arranged alternately; and forming a plurality of support structures located on the surface of the base 100 and a given one of the plurality of support structures being located between a given one of the plurality of first conductive structures and a given one of the plurality of second conductive structures, where the given one of the plurality of support structures is provided with a support layer 120 therein arranged along the first direction X and a cavity 140 divided by the support layer 120, and the given one of the plurality of support structures extends along a side surface of the given one of the plurality of first conductive structures.

Figure 4:
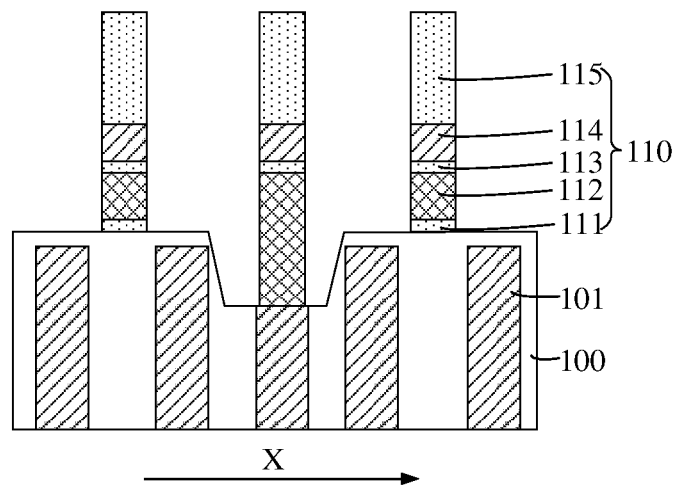
FIGS. 4 to 25 are schematic structural cross-sectional views corresponding to various steps of a method of manufacturing a semiconductor structure according to an embodiment of the present disclosure.

With reference to FIG. 4, a base 100 is provided, a plurality of active structures 101 are arranged at intervals in the base, and a plurality of bit lines 110 are formed. The plurality of bit lines 110 are located on the surface of the base and a given one of the plurality of bit lines 110 is in contact with a given one of the plurality of active structures 101.

In some embodiments, the given one of the plurality of first conductive structures is a bit line 110 extending along the second direction. The second direction intersects the first direction X. Preferably, orthographic projection of the second direction and the orthographic projection of the first direction X on the base 100 are perpendicular to each other. The bit line 110 includes a first barrier layer 111, a polysilicon layer 112, a second barrier layer 113, a conductive layer 114, and a dielectric layer 115 that are stacked.

With reference to FIGS. 5 to 24, the step of forming the plurality of support structures includes: sequentially forming a first support film 102, a first oxide film 103, a second support film 105, a second oxide film 106, and a third support film 116 on the base 100 and on top surfaces and side surfaces of the plurality of first conductive structures; removing, through etching, the first support film 102, the first oxide film 103, the second support film 105, the second oxide film 106, and the third support film 116 by a thickness, to expose the plurality of first conductive structures with a thickness; and removing the first oxide film 103 and the second oxide film 106 through etching, to form the cavity 140, where remaining parts of the first support film 102, second support film 105, and third support film 116 form the support layer.

In some embodiments, the support layer 120 includes a first support layer 121, a second support layer 122, and a third support layer 123, the first support layer 121 is located between the bit line 110 and the cavity 140, the second support layer 122 is located in a middle of the cavity 140, and the third support layer 123 is located between the storage node contact structure formed subsequently and the cavity 140; and a thickness of the first support layer 121 or the third support layer 123 is smaller than or equal to that of the second support layer 122. The second support layer 122 in the cavity 140 is relatively thick, and can support the sides of the cavity 140, such that the support structure can withstand various stresses in the subsequent process, thereby avoiding deformation of the side surfaces of the cavity 140, and enabling the structure of the cavity 140 to be complete. This may avoid that the K value increases to cause the parasitic capacitance between the bit line 110 and the storage node contact structure formed subsequently and lead to the short-circuit risk between them.

Figure 5:
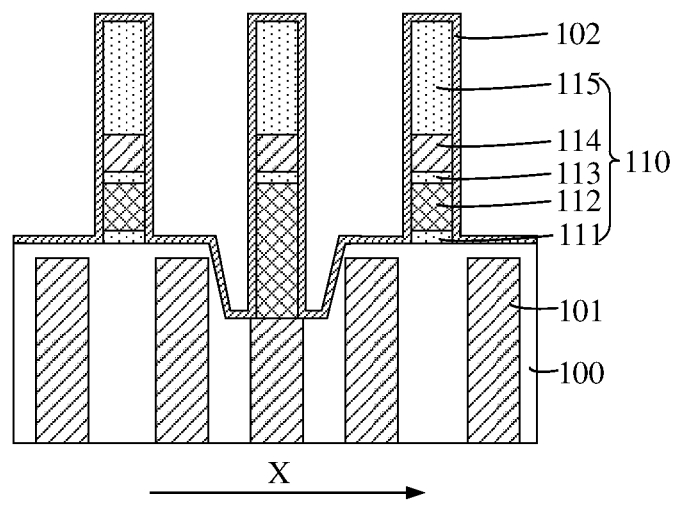

With reference to FIG. 5, a first support film 102 is formed on the surface of the base 100 and the top surfaces and side surfaces of the bit lines 110. In some embodiments, the first support film 102 is formed through the epitaxial growth process. A thickness of the first support film 102 ranges from 1 to 2 nm, and may specifically be 1 nm, 1.3 nm, 1.6 nm or 1.9 nm. The material of the first support film 102 may be silicon boron carbon nitride, silicon nitride, or silicon carbonitride.

Figure 6:
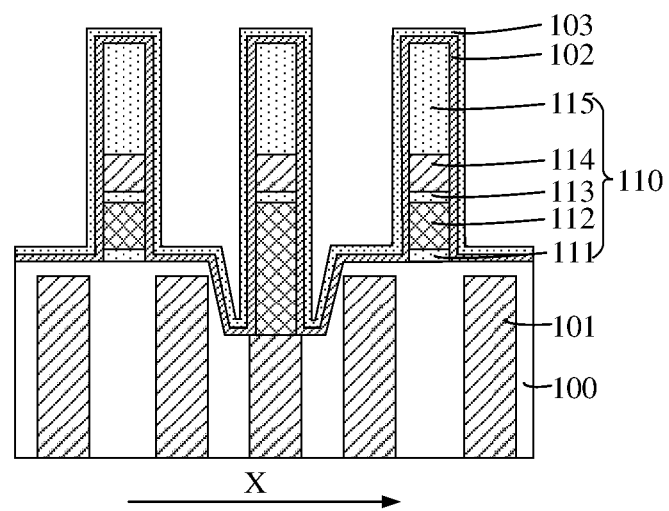

With reference to FIG. 6, a first oxide film 103 is formed on the surface of the first support film 102. In some embodiments, the first oxide film 103 is formed through the atomic layer deposition process. A thickness of the first oxide film 103 ranges from 1 to 3 nm, and may specifically be 1 nm, 1.3 nm, 2.3 nm, or 2.8 nm. The material of the first oxide film 103 may be silicon dioxide or silicon carbonitride.

In some embodiments, an etch selectivity between a material of the first oxide film 103 and a material of the first support film 102 is greater than 50.

Figure 7:
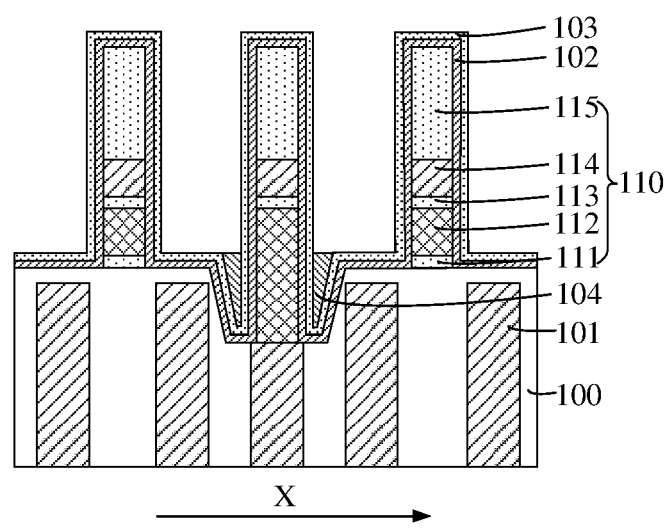

With reference to FIG. 7, an insulating layer 104 is formed on the surface of the first oxide film 103, and a part of the insulating layer 104 higher than the top surface of the first oxide film 103 is removed through etching. In some embodiments, the insulating layer 104 is formed through a thin film deposition process, and a part of the insulating layer 104 higher than the top surface of the first oxide film 103 is removed through a wet etching process. The material of the insulating layer 104 is silicon dioxide or silicon carbonitride.

Figure 8:
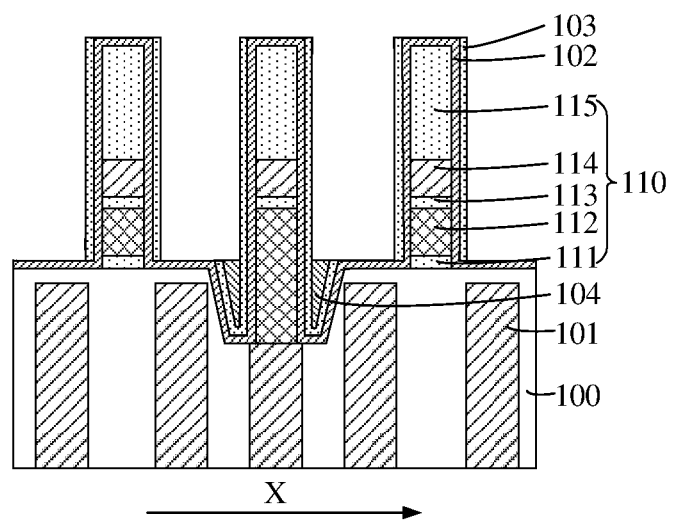

With reference to FIG. 8, of the first oxide film 103, a part higher than the top surface of the first support film 102 and a part at the bottom are removed through etching, and a part of the first oxide film 103 on the side surfaces of the bit lines 110 is retained. In some embodiments, a dry etching process is used to remove a part of the first oxide film 103 to expose the surface of the first support film 102, which is beneficial for the structural stability of the support layer formed subsequently.

Figure 9:
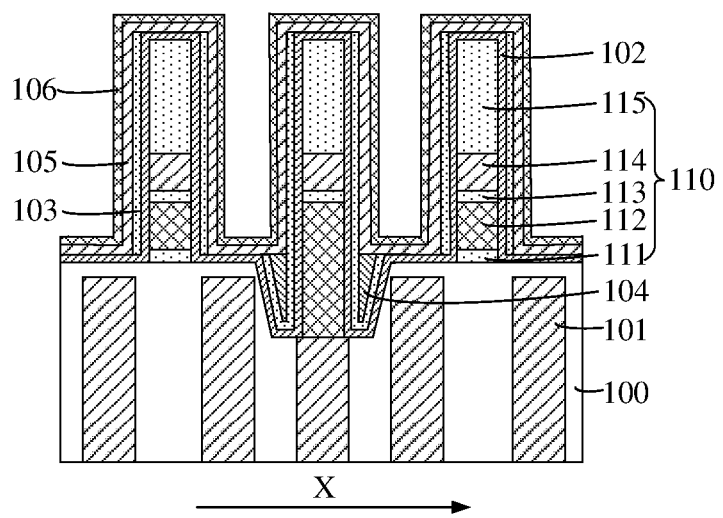

With reference to FIG. 9, a second support film 105 and a second oxide film 106 are sequentially formed on the surface of the first support film 102 and the first oxide film 103. In some embodiments, the second support film 105 and the second oxide film 106 are formed through the atomic layer deposition process. A thickness of the second support film 105 ranges from 2 nm to 4 nm, and may specifically be 2 nm, 2.3 nm, 3.1 nm, or 3.9 nm. The second support film 105 and the first support film 102 may have a same material or not. The second oxide film 106 and the first oxide film 103 may have a same thickness or not. The second oxide film 106 and the first oxide film 103 may have a same material or not.

In some embodiments, an etch selectivity between a material of the first oxide film 103 and a material of the second support film 105 is greater than 50. An etch selectivity between a material of the second oxide film 106 and a material of the first support film 102 is greater than 50. An etch selectivity between the material of the second oxide film 106 and the material of the second support film 105 is greater than 50.

With reference to FIGS. 10 to 14, a spin-on dielectric (SOD) structure is formed to backfill gaps between bit lines, thereby forming a capacitor structure. The SOD structure isolates the transistors in the semiconductor.

Figure 10:
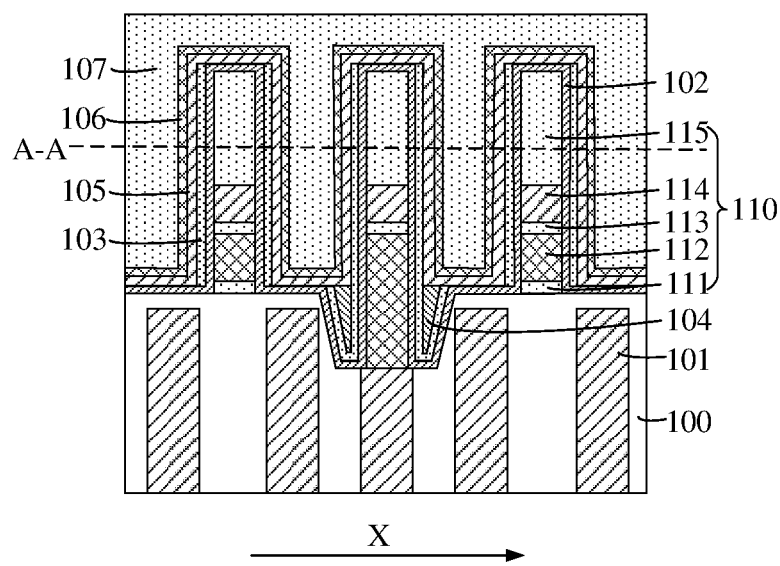
Figure 11:
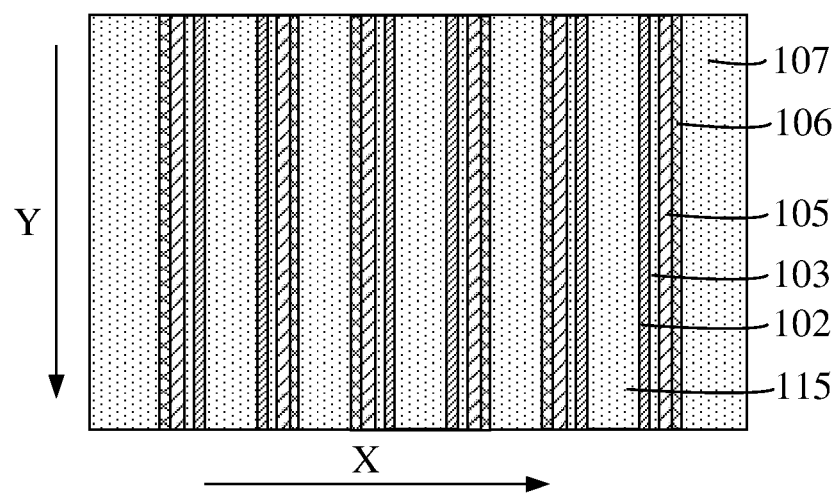

With reference to FIGS. 10 and 11, a sacrificial film 107 is formed between adjacent bit lines 110, and on the top surface of the second oxide film 106. The sacrificial film 107 is formed through a chemical vapor deposition (CVD) process.

Figure 12:
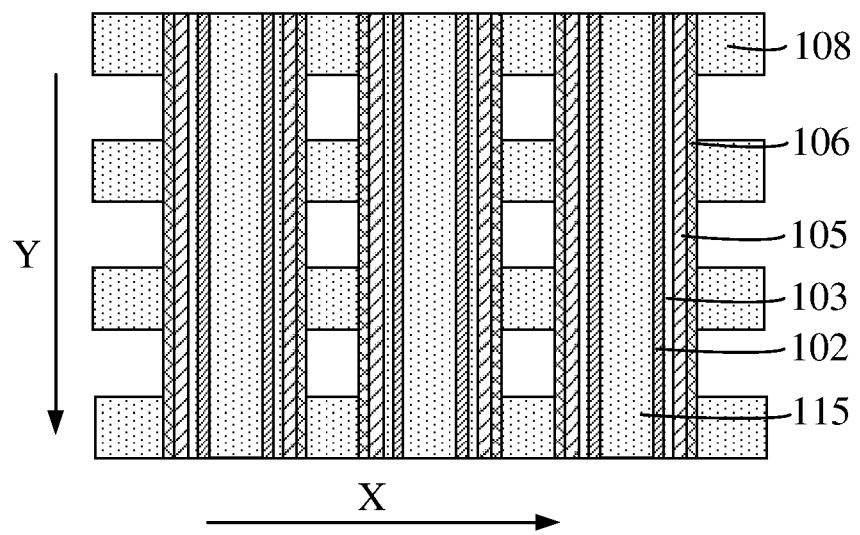
Figure 13:
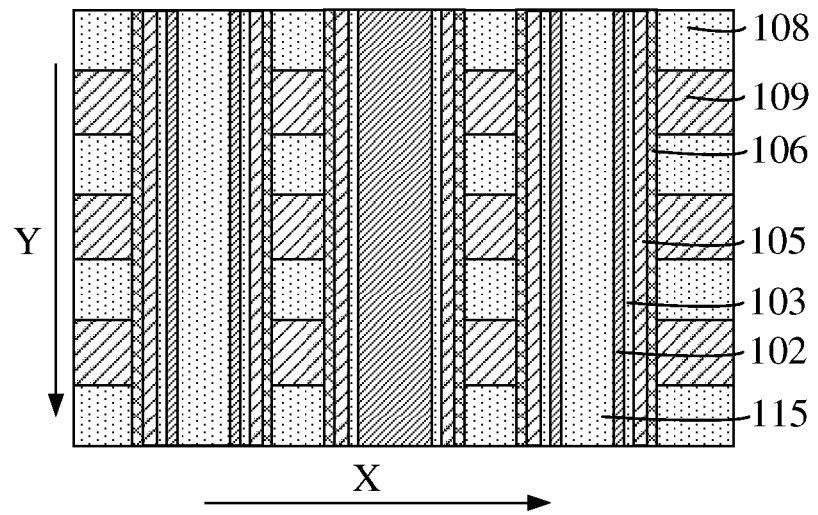
Figure 14:
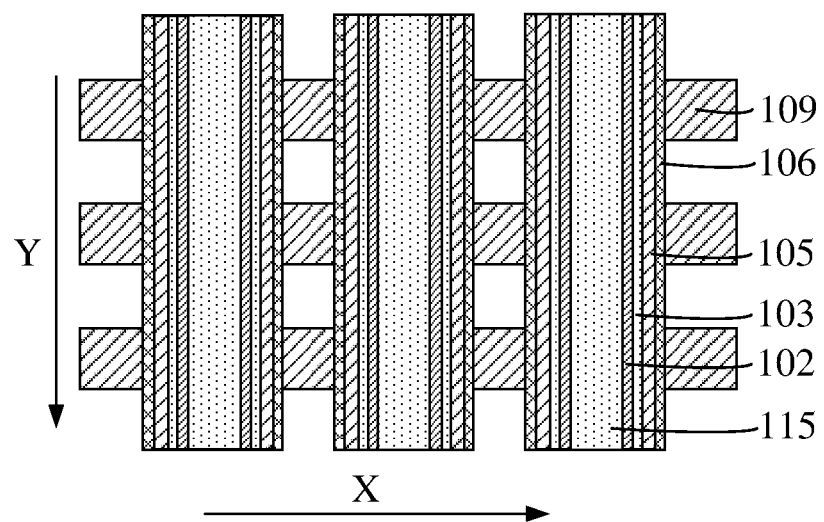

Specifically, with reference to FIG. 12, along the second direction Y, the sacrificial film 107 is etched to form the sacrificial layers 108 arranged at intervals. With reference to FIG. 13, an isolation layer 109 is formed to fill up the region between adjacent sacrificial layers 108. With reference to FIG. 14, the sacrificial layer is removed, to expose the base 100 or the second oxide film 106 at the bottom.

Figure 15:
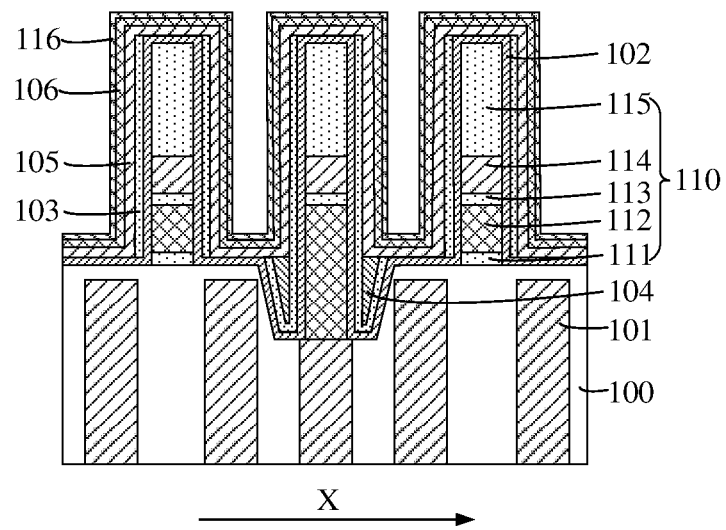

With reference to FIG. 15, a third support film 116 is formed on the surface of the second oxide film 106. In some embodiments, the third support film 116 is formed through the atomic layer deposition process. The third support film 116 and the first support film 102 may have a same thickness or not. The third support film 116 and the first support film 102 may be made of a same material or not.

Figure 16:
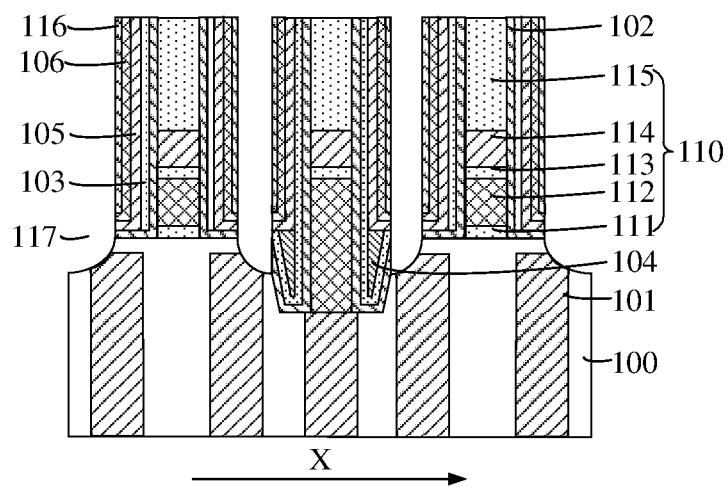

With reference to FIG. 16, a first through hole 117 is formed, and the bottom of the first through hole 117 exposes the surface of the active structure 101 in the base 100, such that the subsequently formed storage node contact structure is connected to the active structure 101.

Figure 17:
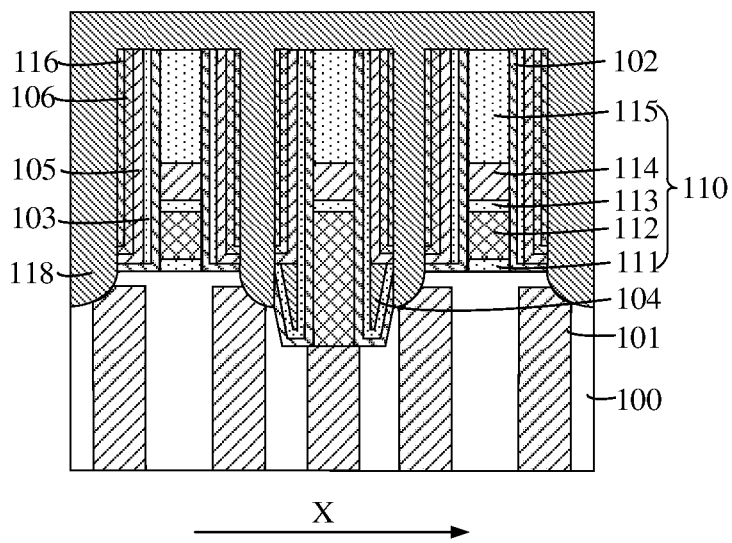

With reference to FIG. 17, a polysilicon film 118 is formed on the surface of the third support film 116 to fill up the first through hole 117.

Figure 18:
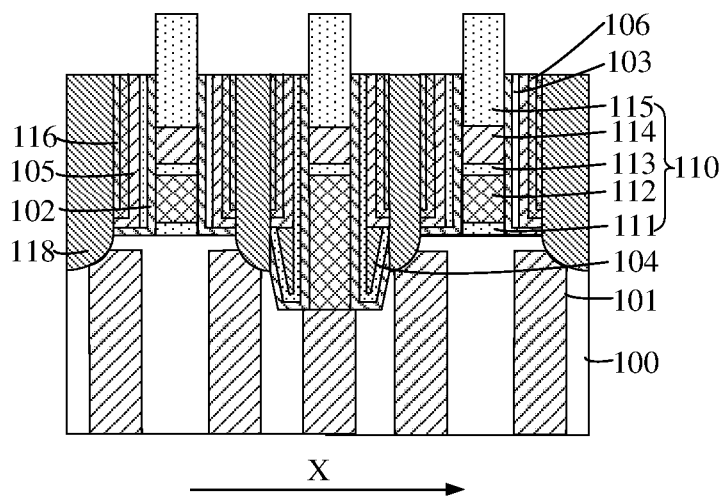

With reference to FIG. 18, the polysilicon film 118 is etched for the first time, while the first support film 102, the first oxide film 103, the second support film 105, the second oxide film 106, and the third support film 116 are etched by a thickness. In some embodiments, the polysilicon film 118 is etched for the first time through dry etching or wet etching.

Figure 19:
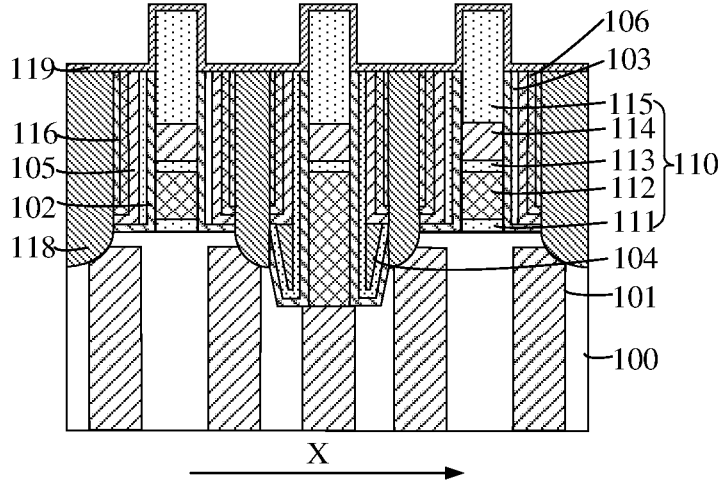

With reference to FIG. 19, a protective layer 119 is formed on the top surfaces of the first support film 102, the first oxide film 103, the second support film 105, the second oxide film 106, the third support film 116, and the bit lines 110, to protect the bit lines 110. The material of the protective layer 119 may be silicon boron carbon nitride, silicon nitride, or silicon carbonitride.

Figure 20:
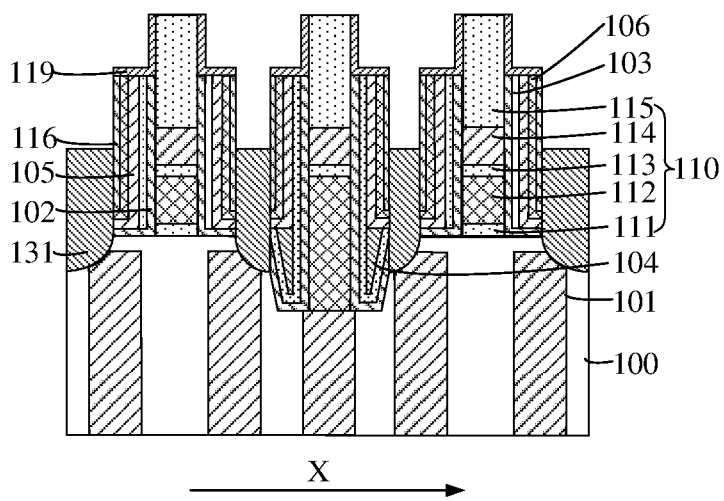

With reference to FIG. 20, the polysilicon film 118 is etched for the second time to form a polysilicon layer, while the protective layer 119 on the tops of the bit lines 110 is etched. The polysilicon layer is the capacitor contact structure 131.

Figure 21:
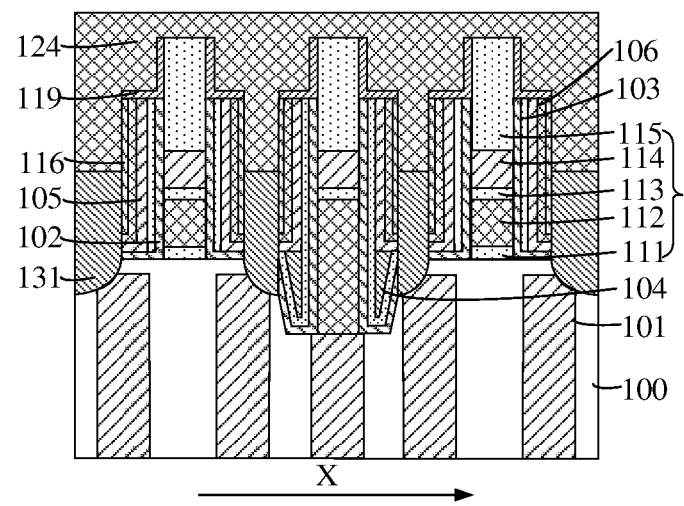

With reference to FIG. 21, a conductive film 124 is formed on the top surfaces of the capacitor contact structures 131 and the bit lines 110.

Figure 22:
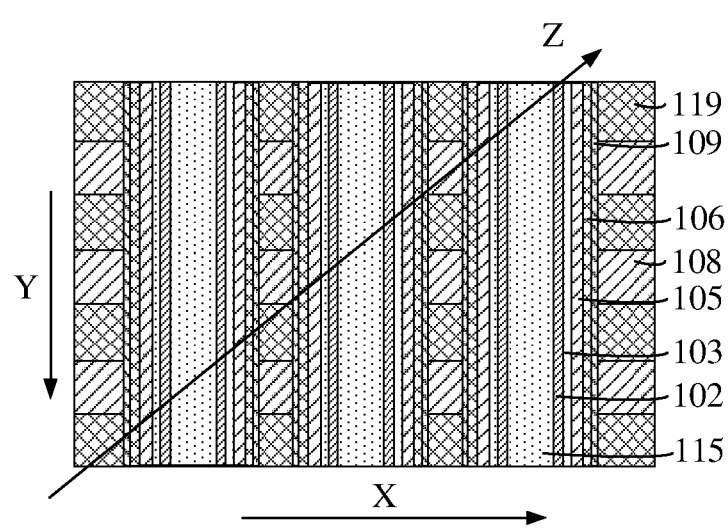
Figure 23:
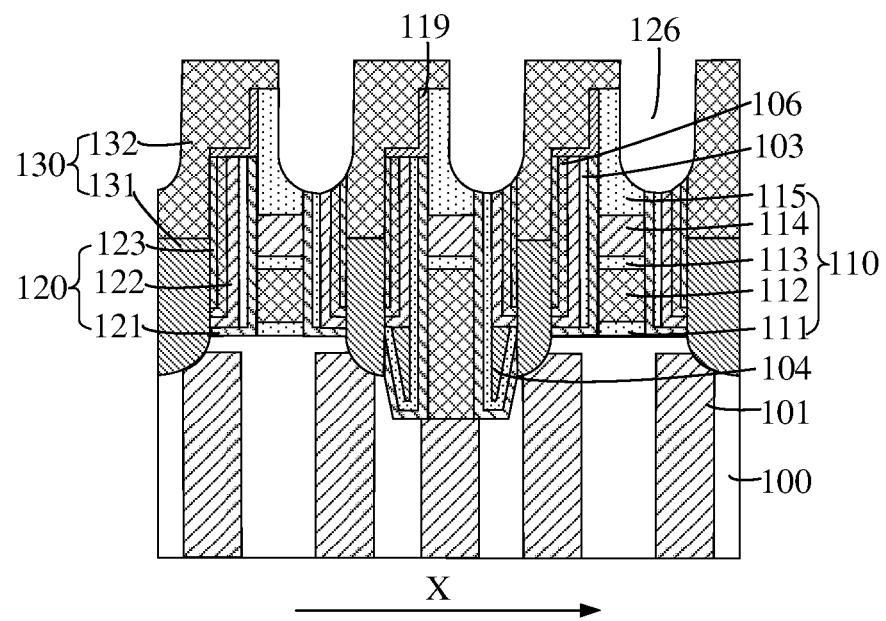
Figure 24:
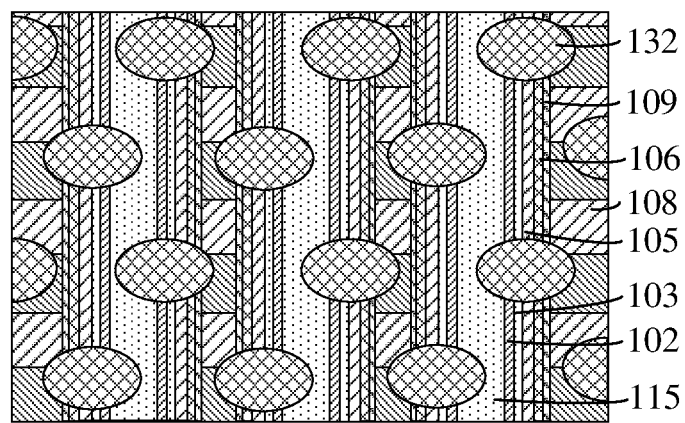

With reference to FIGS. 22 to 24, the conductive film 124 is etched in the first direction X and the third direction Z to form the capacitive conductive layers 132 arranged in a staggered or hexagonal manner. The capacitor contact layer 131 and the capacitor conductive layer 132 form a storage node contact structure 130, and the storage node contact structure 130 serves as a second conductive structure.

Figure 25:
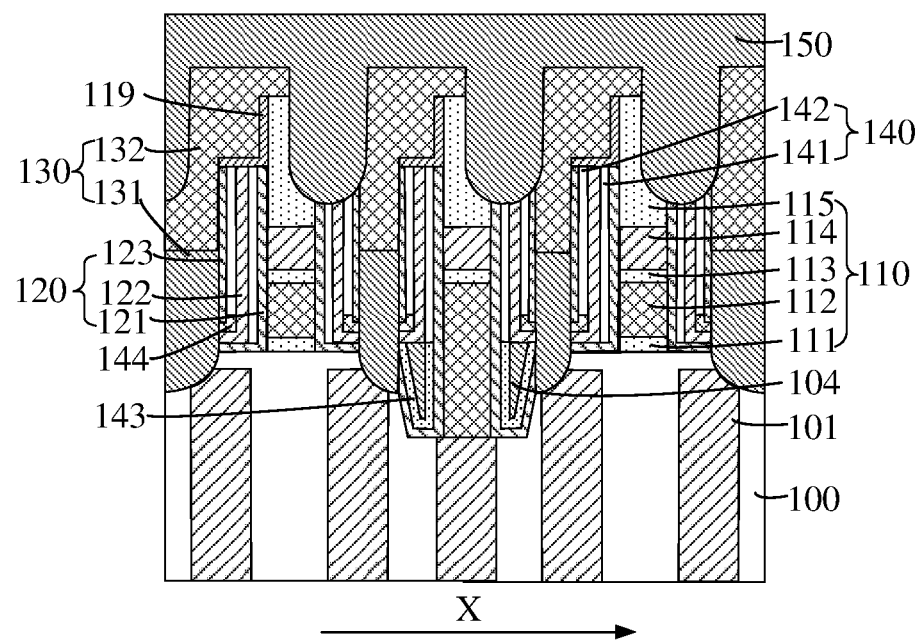

With reference to FIG. 25, the isolation structure 150 is formed. The isolation structure 150 is located between the bit line 110 and the storage node contact structure 130 that are adjacent, and the isolation structure 150 is located on the top surfaces of the bit lines 110 and the top surfaces of the storage node contact structures 130. The isolation structure 150 may be a single-layer structure or a stacked multi-layer structure, and the material of the isolation structure 150 may be one or more selected from the group consisting of silicon dioxide, silicon carbide, or silicon nitride.

Correspondingly, another embodiment of the present disclosure provides a method of manufacturing a semiconductor structure. A method of manufacturing a semiconductor structure provided by another embodiment of the present disclosure is substantially the same as the ones provided by the foregoing embodiments (FIGS. 4 to 25). The main difference is that the given one of the plurality of first conductive structures provided by the foregoing embodiments of the present disclosure is a bit line, and the given one of the plurality of second conductive structures is a storage node contact structure, and the given one of the plurality of first conductive structures and the given one of the plurality of second conductive structures in the semiconductor structure provided by the another embodiment of the present disclosure are both gate structures. Details of contents or elements the same as or similar to those described in the foregoing embodiments are not repeated, and the ones different from the above are described in detail. The method of manufacturing a semiconductor structure provided by another embodiment of the present disclosure is described in detail below with reference to FIGS. 26 to 33.

FIGS. 26 to 33 are schematic structural cross-sectional views corresponding to various steps of the method of manufacturing a semiconductor structure according to another embodiment of the present disclosure.

With reference to FIGS. 26 to 33, the method of manufacturing a semiconductor structure includes: providing a base 200; forming a plurality of first conductive structures and a plurality of second conductive structures, where the plurality of first conductive structures are located on a surface of the base 200 and distributed at intervals along a first direction X, and the plurality of second conductive structures are located on the surface of the base 200, and the plurality of second conductive structures and the plurality of first conductive structures are arranged alternately; and forming a plurality of support structures located on the surface of the base 200 and a given one of the plurality of support structures being located between a given one of the plurality of first conductive structures and a given one of the plurality of second conductive structures, where the given one of the plurality of support structures is provided with a support layer 220 therein arranged along the first direction X and a cavity 240 divided by the support layer 220, and the given one of the plurality of support structures extends along a side surface of the given one of the plurality of first conductive structures.

Figure 26:
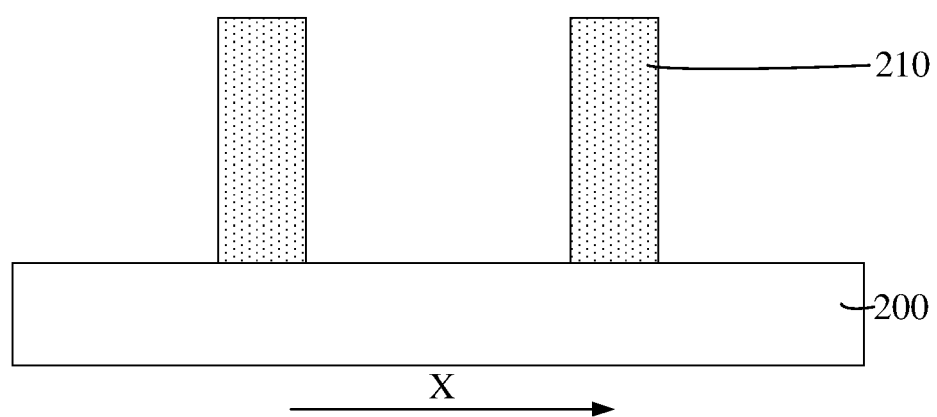
FIGS. 26 to 33 are schematic structural cross-sectional views corresponding to various steps of the method of manufacturing a semiconductor structure according to another embodiment of the present disclosure.

With reference to FIG. 26, a base 200 is provided and a plurality of gate structures 210 are formed on the surface of the base 200 and arranged at intervals along the first direction X.

The given one of the plurality of first conductive structures and the given one of the plurality of plurality of second conductive structures are both the gate structures 210, and the gate structures 210 serve as the word lines of the semiconductor structure. The support structures are located between adjacent gate structures 210.

With reference to FIGS. 27 to 32, the step of forming the plurality of support structures includes: sequentially forming a first spacing film 202, a third oxide film 203, a second spacing film 204, a fourth oxide film 205, and a third spacing film 206 on the surface of the base 200 as well as top surfaces and side surfaces of the gate structures 210; removing, through etching, a part of the third oxide film 203, a part of the second spacing film 204, a part of the fourth oxide film 205, and a part of the third spacing film 206 that are higher than a top of the first spacing film 202; and removing the third oxide film 203 and the fourth oxide film 205 through etching to form the cavity 240, where remaining parts of the first spacing film 202, second spacing film 204, and third spacing film 206 form the support layer 220.

In some embodiments, along the first direction X, the support layer 220 includes a first spacing layer 221, a second spacing layer 222, and a third spacing layer 223, the first spacing layer 221 is located between the gate structure 210 and the cavity 240, the second spacing layer 222 is located in a middle of the cavity 240, and the third spacing layer 223 is located between the isolation structure 250 and the cavity 240; and a thickness of the first spacing layer 221 or the third spacing layer 223 is smaller than or equal to that of the second spacing layer 222. The second spacing layer 222 in the cavity 240 is relatively thick, and can support the side surface of the cavity 240, such that the support structure can withstand various stresses in the subsequent process, thereby avoiding deformation of the side surfaces of the cavity 240, and enabling the structure of the cavity 240 to be complete. This may avoid that the K value increases to cause the parasitic capacitance between adjacent gate structures 210 to increase and lead to the short-circuit risk between them.

Figure 27:
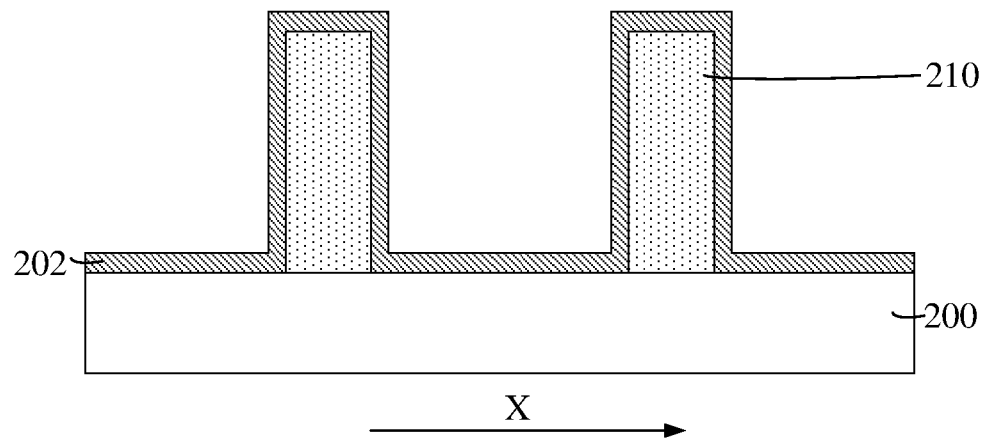

With reference to FIG. 27, a first spacing film 202 is formed on the surface of the base 200 and the top surface and side surface of the gate structure 210. In some embodiments, the first support film 102 is formed through the epitaxial growth process. A thickness of the first spacing film 202 ranges from 2 to 8 nm, and may specifically be 2 nm, 4.6 nm, 6.8 nm or 7.8 nm. The material of the first spacing film 202 may be silicon boron carbon nitride, silicon nitride, or silicon carbonitride.

Figure 28:
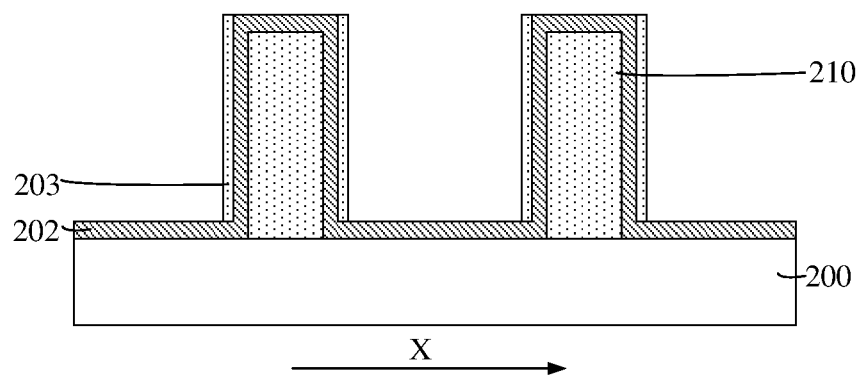

With reference to FIG. 28, a third oxide film 203 is formed on the surface of the first spacing film 202, and of the third oxide film 203, a part higher than the top surface of the first spacing film 202 and a part at the bottom are removed through etching. A part of the third oxide film 203 on the side surface of the gate structure 210 is retained. In some embodiments, the third oxide film 203 is formed through the atomic layer deposition process. A thickness of the third oxide film 203 ranges from 2 to 10 nm, and may specifically be 2 nm, 3.8 nm, 6.2 nm, or 8.9 nm. The material of the third oxide film 203 may be silicon dioxide or silicon carbonitride.

Figure 29:
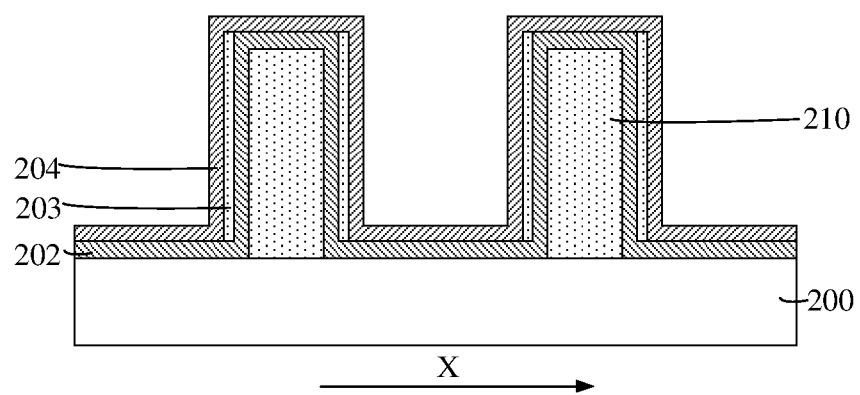

With reference to FIG. 29, a second spacing film 204 is formed on the surface of the third oxide film 203, the first spacing film 202 and the gate structure 210. A thickness of the second spacing film 204 ranges from 2 to 10 nm, and may specifically be 2 nm, 5.6 nm, 8.1 nm, or 9.8 nm. The material of the second spacing film 204 may be silicon boron carbon nitride, silicon nitride, or silicon carbonitride.

Figure 30:
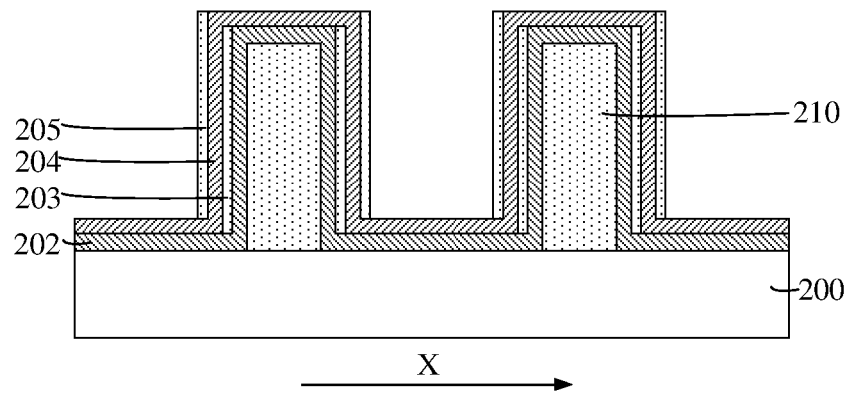

With reference to FIG. 30, a fourth oxide film 205 is formed on the surface of the second spacing film 204, and of the fourth oxide film 205, a part higher than the top surface of the first spacing film 202 and a part at the bottom are removed through etching. A part of the fourth oxide film 205 on the side surface of the gate structure 210 is retained. In some embodiments, the fourth oxide film 205 is formed through the atomic layer deposition process. A thickness of the fourth oxide film 205 ranges from 2 to 10 nm, and may specifically be 2 nm, 3.8 nm, 6.2 nm, or 8.9 nm. The material of the fourth oxide film 205 may be silicon dioxide or silicon carbonitride.

Figure 31:
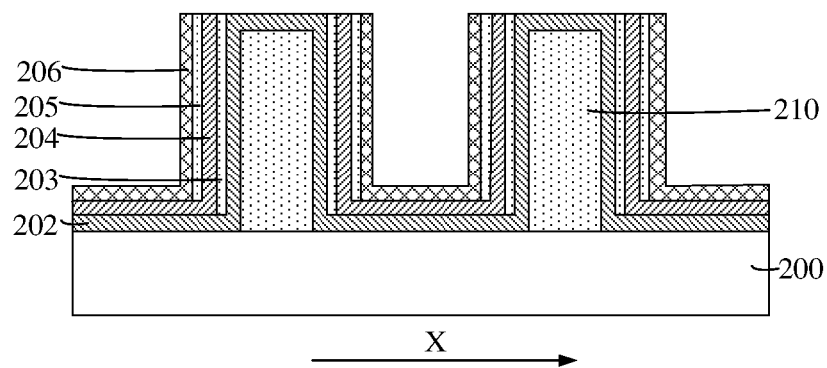

With reference to FIG. 31, a third spacing film 206 is formed on the surfaces of the second spacing film 204, the fourth oxide film 205, and the gate structure 210, while a part of the second spacing film 204 and a part of the third spacing film 206 that are higher than the top of the first spacing film 202 are etched. A thickness of the third spacing film 206 ranges from 4 nm to 10 nm, and may specifically be 4 nm, 5.3 nm, 8.6 nm, or 9.9 nm. The material of the third spacing film 206 may be silicon boron carbon nitride, silicon nitride or silicon carbonitride.

In some embodiments, an etch selectivity between a material of the third oxide film 203 and a material of the first spacing film 202 is greater than 50. An etch selectivity between the material of the third oxide film 203 and a material of the second spacing film 204 is greater than 50. An etch selectivity between a material of the fourth oxide film 205 and the material of the first spacing film 202 is greater than 50. An etch selectivity between the material of the fourth oxide film 205 and the material of the second spacing film 204 is greater than 50.

Figure 32:
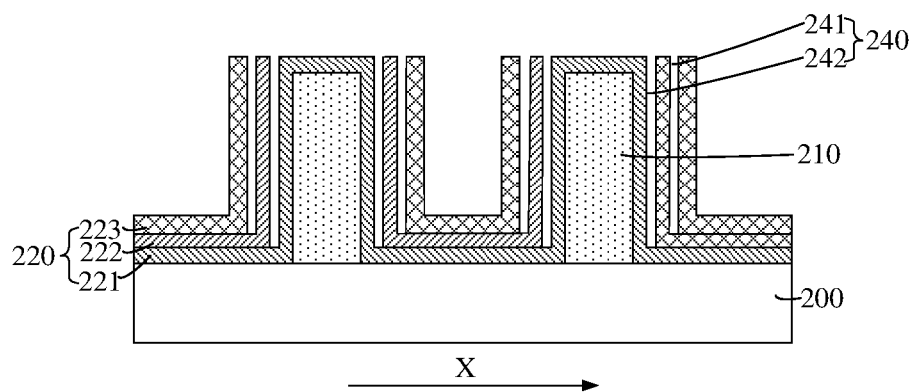

With reference to FIG. 32, the third oxide film 203 and the fourth oxide film 205 are removed through etching to form the cavity 240. The retained first spacing film 202 is used as the first spacing layer 221. The retained second spacing film 204 is used as the second spacing layer 222. The retained third spacing film 206 is used as the third spacing layer 223.

Figure 33:
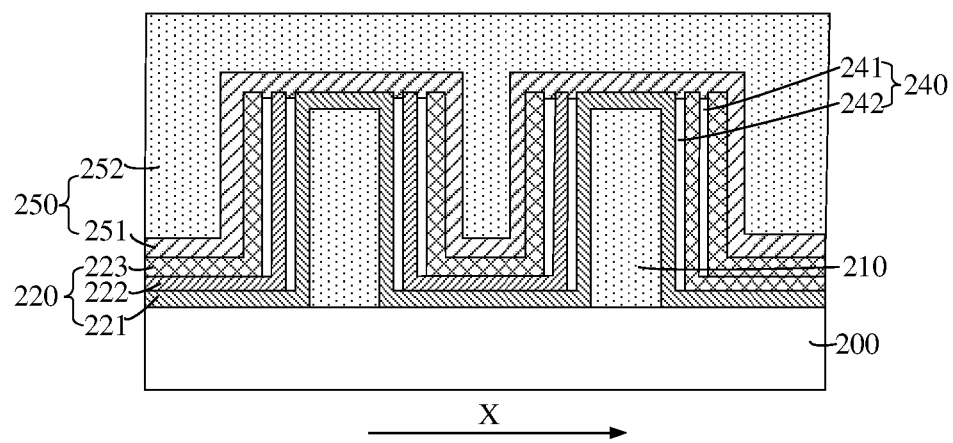

With reference to FIG. 33, an isolation structure 250 is formed between adjacent two of the plurality of support structures. The isolation structure 250 includes a first isolation layer 251 and a second isolation layer 252 that are stacked. The materials of the first isolation layer 251 and the second isolation layer 252 may be one or more selected from the group consisting of silicon dioxide, silicon carbide, or silicon nitride.

Correspondingly, another embodiment of the present disclosure provides a method of manufacturing a semiconductor structure. A method of manufacturing a semiconductor structure provided by another embodiment of the present disclosure is substantially the same as the ones provided by the foregoing embodiments (FIGS. 4 to 25 or 26 to 33). The main difference is that the given one of the plurality of first conductive structures provided by the foregoing embodiment of the present disclosure is a bit line, and the given one of the plurality of second conductive structures is a storage node contact structure, and the given one of the plurality of first conductive structures and the given one of the plurality of second conductive structures in the semiconductor structure provided by the another embodiment of the present disclosure are both metal wire structures. Details of contents or elements the same as or similar to those described in the foregoing embodiments are not repeated, and the ones different from the above are described in detail. The method of manufacturing a semiconductor structure provided by another embodiment of the present disclosure is described in detail below with reference to FIGS. 34 to 40.

FIGS. 34 to 40 are schematic structural cross-sectional views corresponding to various steps of the method of manufacturing a semiconductor structure according to another embodiment of the present disclosure.

With reference to FIGS. 34 to 40, the method of manufacturing a semiconductor structure includes: providing a base 300; forming a plurality of first conductive structures and a plurality of second conductive structures, where the plurality of first conductive structures are located on a surface of the base 300 and distributed at intervals along a first direction X, and plurality of second conductive structures located on the surface of the base 300, and the plurality of second conductive structures and the plurality of first conductive structures are arranged alternately; and forming a plurality of support structures located on the surface of the base 300 and a given one of the plurality of support structures being located between a given one of the plurality of first conductive structures and a given one of the plurality of second conductive structures, where the given one of the plurality of support structures is provided with a support layer 320 therein arranged along the first direction X and a cavity 340 divided by the support layer 320, and the given one of the plurality of support structures extends along a side surface of the given one of the plurality of first conductive structures.

Figure 34:
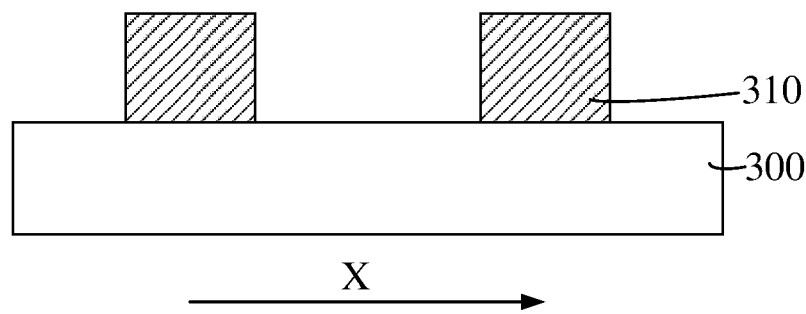
FIGS. 34 to 40 are schematic structural cross-sectional views corresponding to various steps of the method of manufacturing a semiconductor structure according to another embodiment of the present disclosure.

With reference to FIG. 34, a base 300 is provided and a plurality of metal wire structures 310 are formed on the surface of the base 300 and arranged at intervals along the first direction X.

In some embodiments, the given one of the plurality of first conductive structures and the given one of the plurality of second conductive structures are both metal wire structures 310, and the metal wire structure 310 serve as the solder joints of the semiconductor structure. The support structures are located between adjacent metal wire structures 310.

With reference to FIGS. 35 to 39, the step of forming the plurality of support structures includes: sequentially forming a fourth spacing film 301, a fifth oxide film 302, a fifth spacing film 303, and a sixth oxide film 304 on the base 300 and on top surfaces and side surfaces of the metal wire structures 310; removing, through etching, a part of the fifth oxide film 302, a part of the fifth spacing film 303, and a part of the sixth oxide film 304 that are higher than a top of the fourth spacing film 301; and removing the fifth oxide film 302 and the sixth oxide film 304, to form the cavity, where the fourth spacing film 301 and a remaining part of the fifth spacing film 303 jointly constitute the support layer 320.

In some embodiments, along the first direction X, the support layer 320 includes a fourth spacing layer 321 and a fifth spacing layer 322. The fourth spacing layer 321 is located between the metal wire structure 310 and the cavity 340. The fifth spacing layer 322 is located in the middle of the cavity 340. The fourth spacing layer 321 is thinner than the fifth spacing layer 322. The fifth spacing layer 322 in the cavity 340 is relatively thick, and can support the side surface of the cavity 340, such that the support structure can withstand various stresses in the subsequent process, thereby avoiding deformation of the side surfaces of the cavity 340, and enabling the structure of the cavity 340 to be complete. This may avoid that the K value increases to cause the parasitic capacitance between adjacent metal wire structures 310 to increase and lead to the short-circuit risk between them. A thickness of the fifth spacing layer 322 ranges from 4 nm to 10 nm, and may specifically be 4 nm, 5.3 nm, 8.6 nm, or 9.9 nm.

In some embodiments, along the first direction X, the thickness of the cavity 340 ranges from 2 nm to 20 nm. The cavity 340 includes a first cavity 341 and a second cavity 342 separated by the fourth spacing layer 322. The thickness of the first cavity 341 and the thickness of the second cavity 342 both range from 2 nm to 10 nm, and may be specifically, 2 nm, 3.8 nm, 6.2 nm, or 8.9 nm.

Figure 35:
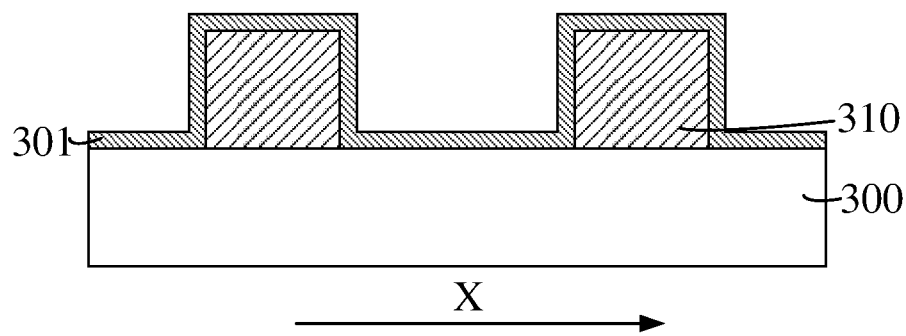

With reference to FIG. 35, a fourth spacing film 301 is formed on the surface of the base 300 and the top surface and side surface of the metal wire structure 310. A thickness of the fourth spacing film 301 ranges from 2 to 8 nm, and may specifically be 2 nm, 4.6 nm, 6.8 nm, or 7.8 nm. The material of the fourth spacing film 301 may be silicon boron carbon nitride, silicon nitride, or silicon carbonitride.

Figure 36:
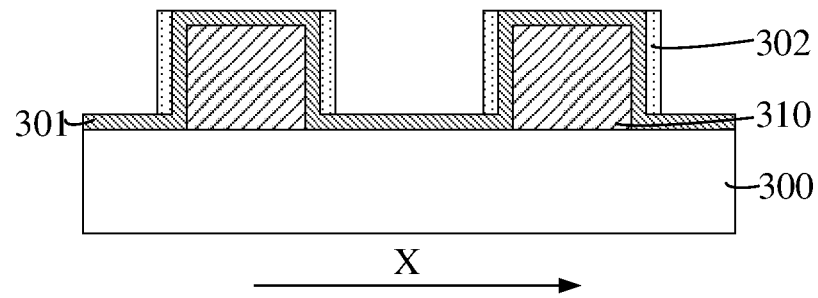

With reference to FIG. 36, a fifth oxide film 302 is formed on the surface of the fourth spacing film 301, and of the fifth oxide film 302, a part higher than the top surface of the fourth spacing film 301 and a part at the bottom are removed through etching. A part of the fifth oxide film 302 on the side surface of the metal wire structure 310 is retained. A thickness of the fifth oxide film 302 ranges from 2 to 8 nm, and may specifically be 2 nm, 4.6 nm, 6.8 nm, or 7.8 nm. The material of the fifth oxide film 302 may be silicon dioxide or silicon carbonitride.

Figure 37:
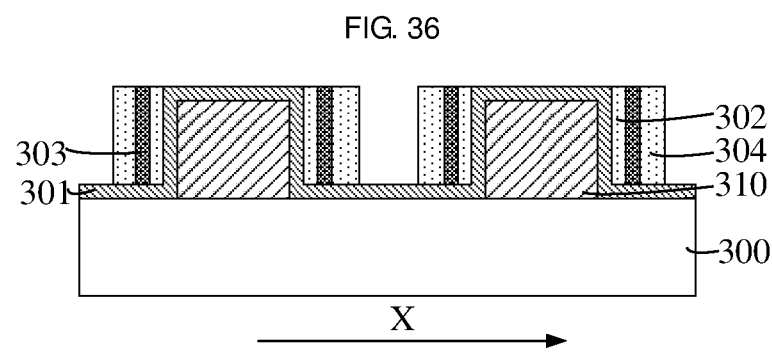

With reference to FIG. 37, a fifth spacing film 303 is formed on the fourth spacing film 301, the fifth oxide film 302, and the metal wire structure 310. A thickness of the fifth spacing film 303 ranges from 4 to 10 nm, and may specifically be 4 nm, 5.3 nm, 8.6 nm, or 9.9 nm. The material of the fifth spacing film 303 may be silicon boron carbon nitride, silicon nitride, or silicon carbonitride.

Figure 38:
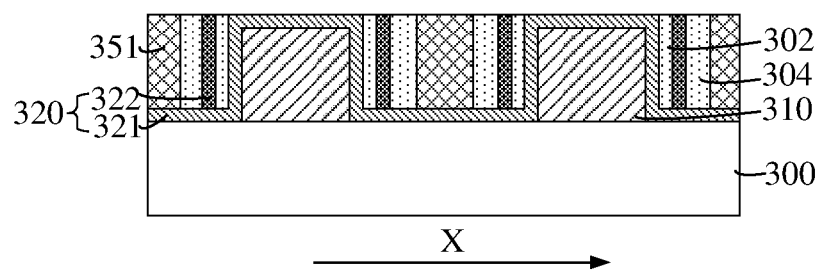

With reference to FIG. 38, a sixth oxide film 304 is formed on the surface of the fifth spacing film 303, and of the sixth oxide film 304, a part higher than the top surface of the fifth spacing film 303 and a part at the bottom are removed through etching. A part of the sixth oxide film 304 on the side surface of the metal wire structure 310 is retained. A thickness of the sixth oxide film 304 ranges from 2 to 8 nm, and may be specifically be 2 nm, 4.6 nm, 6.8 nm, or 7.8 nm. The material of the sixth oxide film 304 may be silicon dioxide or silicon carbonitride.

Figure 39:
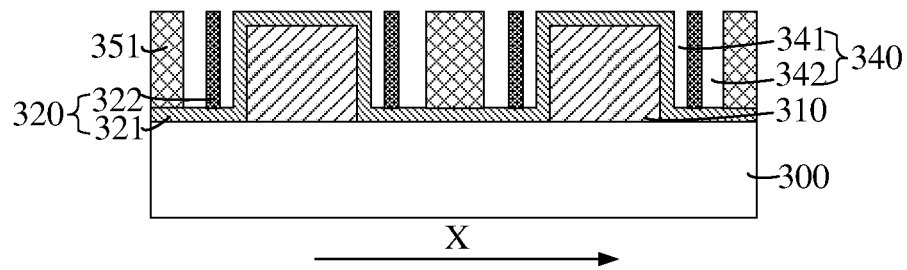

With reference to FIG. 39, the fifth oxide film 302 and the sixth oxide film 304 are removed through etching to form the cavity. The retained fourth spacing film 301 is used as the fourth spacing layer 321. The retained fifth spacing film 303 is used as the fifth spacing layer 322. A first isolation layer 351 is formed between adjacent support structures. Along the first direction X, a thickness of the first isolation layer 351 ranges from 5 nm to 30 nm. A material of the first isolation layer 351 may be one or more selected from the group consisting of silicon dioxide, silicon carbide or silicon nitride.

Figure 40:
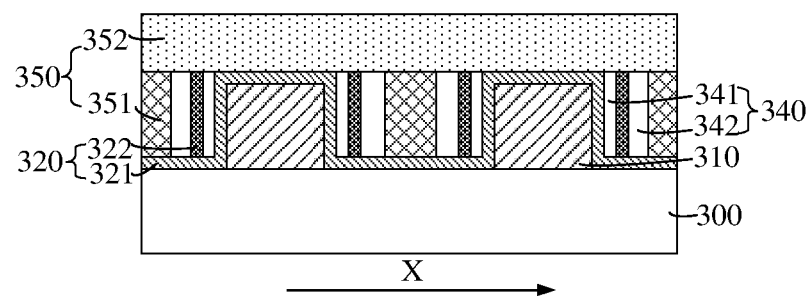

With reference to FIG. 40, a second isolation layer 352 is formed on the top surfaces of the support structures, the top surfaces of the metal wire structures 310, and the top surface of the first isolation layer 351. The first isolation layer 351 and the second isolation layer 352 form the isolation structure 350. A material of the second isolation layer 352 may be one or more selected from the group consisting of silicon dioxide, silicon carbide or silicon nitride.

Those of ordinary skill in the art can understand that the above implementations are specific embodiments for implementing the present disclosure; and in practical applications, various changes may be made in terms of forms and details without departing from the spirit and scope of the present disclosure. Any person skilled in the art may make changes and modifications without departing from the spirit and scope of the present disclosure. Therefore, the protection scope of the present disclosure should be subject to the scope defined by the claims.

The invention claimed is:

1. A semiconductor structure, comprising:
   a base;
   a plurality of first conductive structures, located on a surface of the base and distributed at intervals along a first direction;
   a plurality of second conductive structures, located on the surface of the base, and the plurality of second conductive structures and the plurality of first conductive structures being arranged alternately; and
   a plurality of support structures, located on the surface of the base and a given one of the plurality of support structures being located between a given one of the plurality of first conductive structures and a given one of the plurality of second conductive structures, wherein the given one of the plurality of support structures is provided with a support layer therein arranged along the first direction and a cavity divided by the support layer, and the given one of the plurality of support structures extends along a side surface of the given one of the plurality of first conductive structures.

2. The semiconductor structure according to claim 1, wherein the given one of the plurality of first conductive structures is a bit line, and the given one of the plurality of second conductive structures is a storage node contact structure; and the bit line extends along a second direction, the second direction intersects the first direction, the bit line comprises a conductive layer and a dielectric layer that are stacked, and a top surface of the support layer away from the base is not lower than a top surface of the conductive layer.

3. The semiconductor structure according to claim 2, wherein along a direction perpendicular to the surface of the base, the support layer is as high as ⅓ to ⅔ of the bit line.

4. The semiconductor structure according to claim 2, wherein along the first direction, the support layer comprises a first support layer, a second support layer, and a third support layer, the first support layer is located between the bit line and the cavity, the second support layer is located in a middle of the cavity, and the third support layer is located between the storage node contact structure and the cavity;

and a thickness of the first support layer or the third support layer is smaller than or equal to that of the second support layer.

5. The semiconductor structure according to claim 4, wherein the thickness of the second support layer ranges from 2 nm to 4 nm.

6. The semiconductor structure according to claim 1, further comprising: an isolation structure located between adjacent two of the plurality of support structures, wherein the given one of the plurality of support structures further extends along a side surface of the given one of the plurality of second conductive structures.

7. The semiconductor structure according to claim 6, wherein the given one of the plurality of first conductive structures and the given one of the plurality of second conductive structures are both gate structures; and along the first direction, a thickness of the cavity ranges from 2 nm to 20 nm.

8. The semiconductor structure according to claim 7, wherein along the first direction, the support layer comprises a first spacing layer, a second spacing layer, and a third spacing layer, the first spacing layer is located between the gate structure and the cavity, the second spacing layer is located in a middle of the cavity, and the third spacing layer is located between the isolation structure and the cavity; and a thickness of the first spacing layer or the third spacing layer is smaller than or equal to a thickness of the second spacing layer.

9. The semiconductor structure according to claim 6, wherein the given one of the plurality of first conductive structures and the given one of the plurality of second conductive structures are both metal wire structures; and along the first direction, a thickness of the cavity ranges from 2 nm to 20 nm.

10. The semiconductor structure according to claim 9, wherein along the first direction, a thickness of the isolation structure ranges from 5 nm to 30 nm.

11. The semiconductor structure according to claim 1, wherein along the first direction, a ratio of a thickness of the cavity to a thickness of the support layer ranges from 1/3 to 4/3.

12. The semiconductor structure according to claim 1, wherein a material of the support layer comprises silicon nitride, silicon carbonitride, or silicon boron carbon nitride.

13. A method of manufacturing a semiconductor structure, comprising:
providing a base;
forming a plurality of first conductive structures and a plurality of second conductive structures, wherein the plurality of first conductive structures are located on a surface of the base and are distributed at intervals along a first direction, and the plurality of second conductive structures are located on the surface of the base, and the plurality of second conductive structures and the plurality of first conductive structures are arranged alternately; and
forming a plurality of support structures located on the surface of the base and a given one of the plurality of support structures being located between a given one of the plurality of first conductive structures and a given one of the plurality of second conductive structures, wherein the given one of the plurality of support structures is provided with a support layer therein arranged along the first direction and a cavity divided by the support layer, and the given one of the plurality of support structures extends along a side surface of the given one of the plurality of first conductive structures.

14. The method of manufacturing a semiconductor structure according to claim 13, wherein the given one of the plurality of first conductive structures is a bit line, and the given one of the plurality of second conductive structures is a storage node contact structure; and the forming a plurality of support structures comprises:
sequentially forming a first support film, a first oxide film, a second support film, a second oxide film, and a third support film on the base and on top surfaces and side surfaces of the plurality of first conductive structures;
removing, through etching, the first support film, the first oxide film, the second support film, the second oxide film, and the third support film by a thickness, to expose the plurality of first conductive structures with a thickness; and
removing, through etching, the first oxide film and the second oxide film, to form the cavity, wherein remaining parts of the first support film, second support film, and third support film form the support layer.

15. The method of manufacturing a semiconductor structure according to claim 14, wherein an etch selectivity between a material of the first oxide film and a material of the first support film is greater than 50; and an etch selectivity between the material of the first oxide film and a material of the second support film is greater than 50.

16. The method of manufacturing a semiconductor structure according to claim 14, wherein an etch selectivity between a material of the second oxide film and the material of the first support film is greater than 50; and an etch selectivity between the material of the second oxide film and the material of the second support film is greater than 50.

17. The method of manufacturing a semiconductor structure according to claim 13, wherein the given one of the plurality of first conductive structures and the given one of the plurality of second conductive structures are both gate structures; and the forming a plurality of support structures comprises:
sequentially forming a first spacing film, a third oxide film, a second spacing film, a fourth oxide film, and a third spacing film on the surface of the base as well as top surfaces and side surfaces of the gate structures;
removing, through etching, a part of the third oxide film, a part of the second spacing film, a part of the fourth oxide film, and a part of the third spacing film that are higher than a top of the first spacing film; and
removing the third oxide film and the fourth oxide film through etching to form the cavity, wherein remaining parts of the first spacing film, second spacing film, and third spacing film form the support layer.

18. The method of manufacturing a semiconductor structure according to claim 13, wherein the given one of the plurality of first conductive structures and the given one of the plurality of second conductive structures are both metal wire structures; and the forming a plurality of support structures comprises:
sequentially forming a fourth spacing film, a fifth oxide film, a fifth spacing film, and a sixth oxide film on the base and on top surfaces and side surfaces of the metal wire structures;
removing, through etching, a part of the fifth oxide film, a part of the fifth spacing film, and a part of the sixth oxide film that are higher than a top of the fourth spacing film; and
removing the fifth oxide film and the sixth oxide film, to form the cavity, wherein the fourth spacing film and a remaining part of the fifth spacing film jointly constitute the support layer.

* * * * *